United States Patent

Futami et al.

[11] Patent Number: 5,079,493
[45] Date of Patent: Jan. 7, 1992

[54] ULTRA-PRECISE POSITIONING SYSTEM

[75] Inventors: Shigeru Futami; Akihiro Furutani, both of Ibaraki, Japan

[73] Assignee: Research Development Corporation of Japan, Tsukuba, Japan

[21] Appl. No.: 531,229

[22] Filed: May 31, 1990

[30] Foreign Application Priority Data

May 31, 1989 [JP] Japan .................................. 1-139578

[51] Int. Cl.⁵ ............................................ G05B 19/10
[52] U.S. Cl. ................................ 318/640; 318/563; 318/632
[58] Field of Search ................................ 318/560-645

[56] References Cited

U.S. PATENT DOCUMENTS

| | | | |
|---|---|---|---|
| 3,889,164 | 6/1975 | Nishizawa et al. | 318/640 |
| 4,604,560 | 8/1986 | Inagaki et al. | 318/563 X |
| 4,724,370 | 2/1988 | Moraru et al. | 318/632 X |
| 4,808,901 | 2/1989 | Sakamoto | 318/687 |
| 4,817,007 | 3/1989 | New | 318/571 X |
| 4,843,293 | 6/1989 | Futami | 318/610 X |
| 4,914,725 | 4/1990 | Belser et al. | 318/563 X |
| 4,916,375 | 4/1990 | Kurakake et al. | 318/600 X |

OTHER PUBLICATIONS

"Nanometer Positioning and its Micro-Dynamics", Shigeru Futami, Akihiro Furutani and Shoiciro Yoshida, Yoshida Nano-Mechanism Project, Research Development Corporation of Japan, Mar. 6, 1990.

Primary Examiner—Paul Ip
Attorney, Agent, or Firm—Armstrong, Nikaido, Marmelstein, Kubovcik & Murray

[57] ABSTRACT

An ultra-precise positioning system includes a movable part, a rolling guide, a fixed part in supporting contact with the rolling guide, and a driving device for driving the movable part. The driving device includes a non-contact motor which applies a force to the movable part without touching engagement with the movable part. The system also includes a position measuring device for measuring a position of the movable part, a position reference generator for generating a reference position of the movable part, and a positioning control device for controlling the position of the movable part by comparing the measured position to the reference position, the positioning control device having a first control mode in a first operational region in which a resistance force arising due to displacement of the movable part varies in magnitude as a function of the force applied to the movable part by the driving device, and a second control mode in a second operational region in which frictional resistance force of the rolling guide is in a saturated condition and normal rolling of the rolling guide takes place, so that a resistance force resisting the force applied to the movable part by the driving device is substantially constant.

7 Claims, 26 Drawing Sheets

POSITIONING TO POSITIVE DIRECTION

POSITIONING TO NEGATIVE DIRECTION

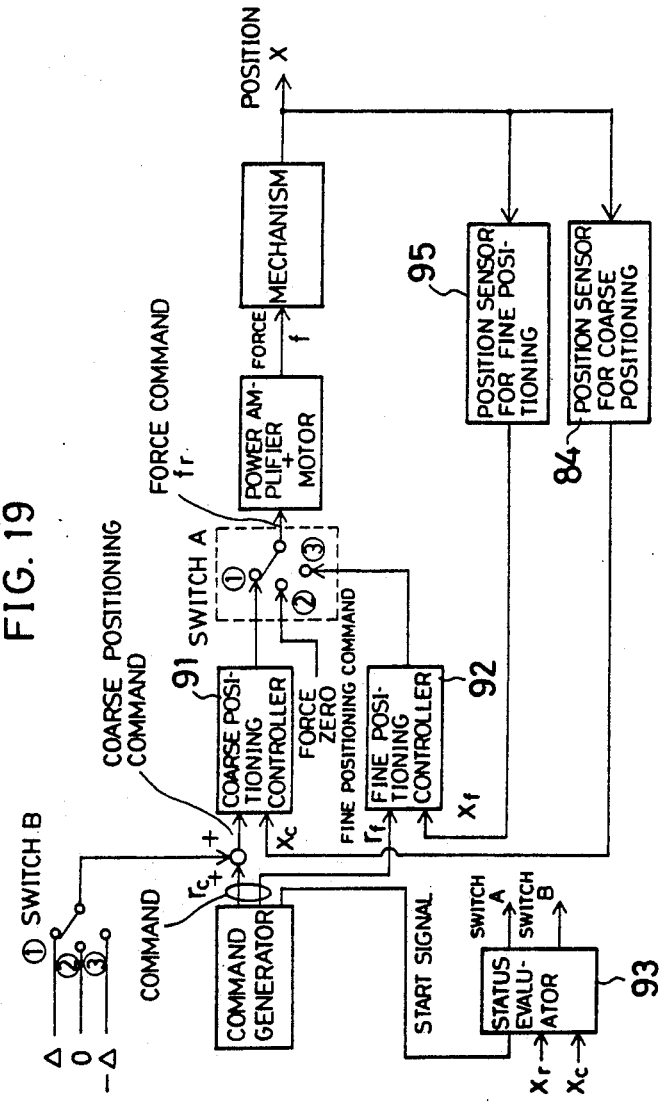
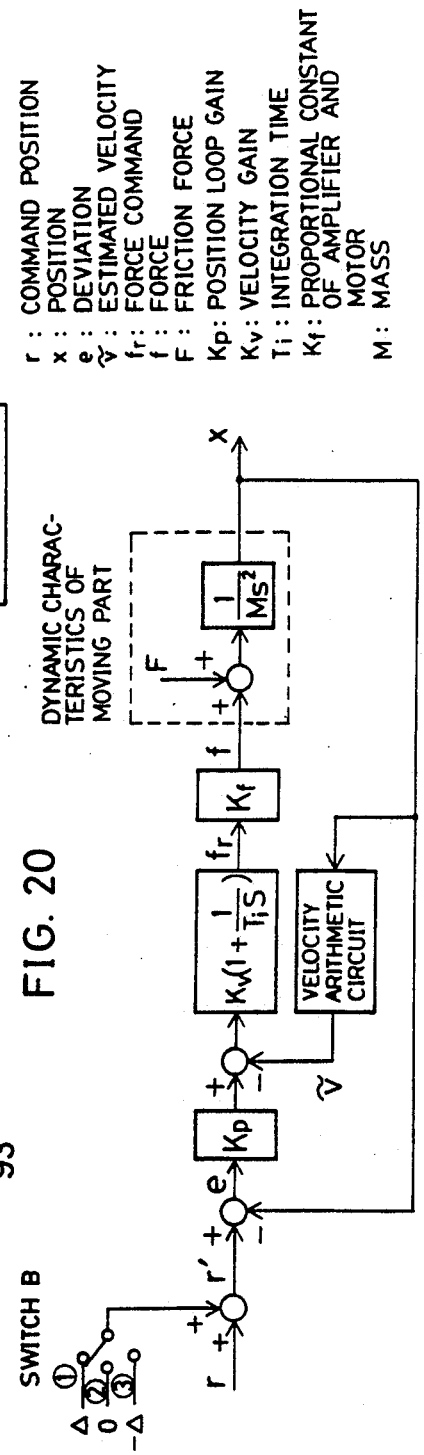
FIG. 19
FIG. 20

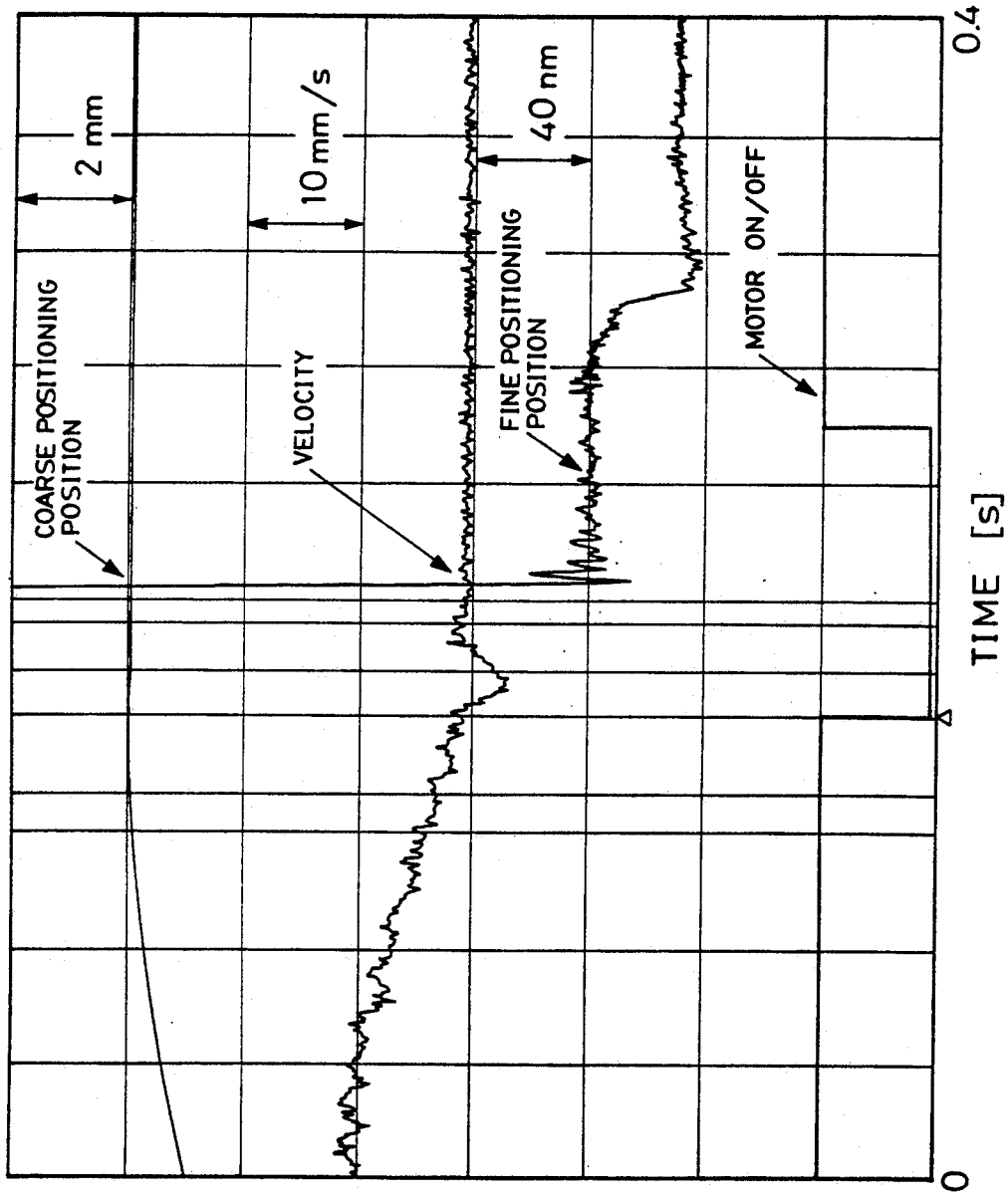

ULTRA-PRECISE POSITIONING SYSTEM

BACKGROUND OF THE INVENTION

The present invention relates to an ultra-precise positioning system, by which it is possible to perform the nanometer positioning with high speed and long stroke.

Ultra-precise positioning is one of the basic and important technologies. Particularly, there are strong demands on the ultra-precise nanometer positioning in the fields of semiconductor manufacture, laser optics and optoelectronics machining. Positioning must be performed not only with high precision but also at high speed, whereas high accuracy and high speed are contradictory, and it is not easy to provide both properties at the same time.

To solve these problems, it has been customary in the past to design independent positioning systems for coarse positioning and fine positioning in series, and to provide high speed property by coarse positioning system, while high accuracy is attained by fine positioning system.

The conventional type precise positioning system as shown in FIG. 1 is an apparatus using two-axis moving coil type linear motor 53, and it is applied to air suspension type XY stage for X-ray exposure system. In this system, coarse positioning system is driven by a linear motor 53, and it is stopped by a vacuum locking mechanism 57. Positioning is performed by vacuum locking system to switch over coarse and fine positioning of FIG. 1 (b) and by fine positioning caused by the deformation of XY fine positioning spring 61 as shown in the arrangement of fine positioning spring. The control block is shown in FIG. 2, and FIG. 3 represents the positioning sequence consisting of coarse positioning operation, locking operation and fine positioning operation.

However, the conventional type precision positioning system as described above is complicated in its mechanism and is difficult to be a small size, and the ridigity of the fixing spring by vacuum locking cannot be increased. Accordingly, natural frequency is low and the response cannot be increased. Also, because the positioning sequence is in the order of: coarse positioning→stop→locking→fine positioning. Because much time is required for stop and locking, the positioning time becomes long.

SUMMARY OF THE INVENTION

The object of this invention is to offer a precise positioning system, which can be a small size and be simple structure and by which it is possible to perform the positioning with high accuracy and high resolution. Another object of this invention is to divide the behavioral regions of the control system and to perform coarse positioning and fine positioning for a single mechanism.

To attain these objects, the present invention provides an ultra-precise positioning system, which is contacted only by a rolling guide, pressurized between a moving part and a fixed part, and which can be driven by a non-contact motor. The control system is divided into the region II where the displacement of the moving part depends upon the force, and the region III where the friction force of the rolling guide is saturated, and normal rolling takes place. It is preferable that the region II has a region I having reversible and elastic spring characteristics of the rolling guide. The high speed and long stroke coarse positioning is performed in the region III, and high resolution fine positioning in the regions I and II.

The properties of the regions I, II and III of the rolling guide are utilized. Because the region I has very good linearity of spring characteristics and high natural frequency, the positioning can be achieved with high resolution and quick response by performing the positioning in the region I of spring system with high rigidity. Particularly, in the region I, the nanometer positioning within the displacement about ±100 nm from the equilibrium position can be achieved by utilizing this property.

Still other objects and advantages of the invention will in part be obvious and will in part be apparent from the specification.

The invention accordingly comprises the features of construction, combinations of elements, and arrangement of parts which will be exemplified in the construction hereinafter set forth, and the scope of the invention will be indicated in the claims.

BRIEF DESCRIPTION OF THE DRAWINGS

FIG. 19 shows the Embodiment 2 of an ultra-precise positioning system by this invention;

FIG. 20 shows the configuration of coarse positioning controller;

FIG. 35 and 38 show responses of motor ON/OFF signal, coarse position, velocity and fine position when the entire positioning control of the Embodiment 2 was done experimentally;

DESCRIPTION OF PREFERRED EMBODIMENTS

In the following, the detail of the present invention will be described in connection with the drawings.

Figure 1A:
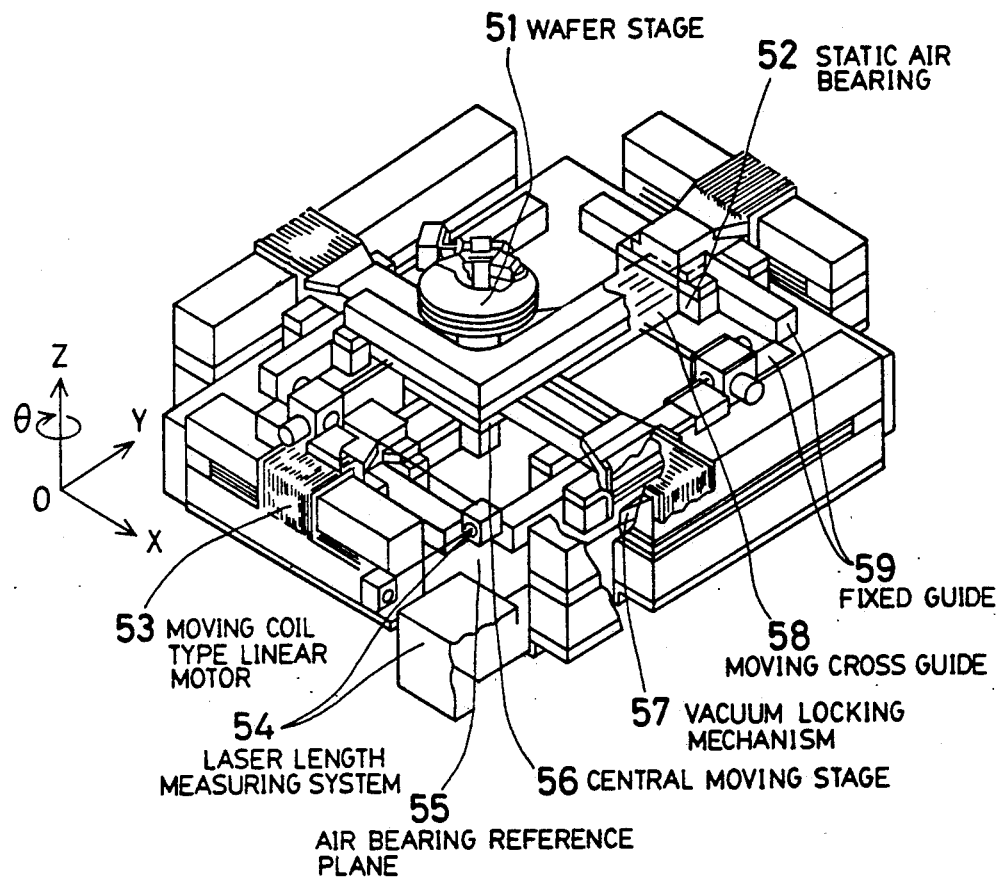
FIGS. 1(a) and 1(b) are illustrations to show a conventional example of a precise positioning system.
Figure 1B:
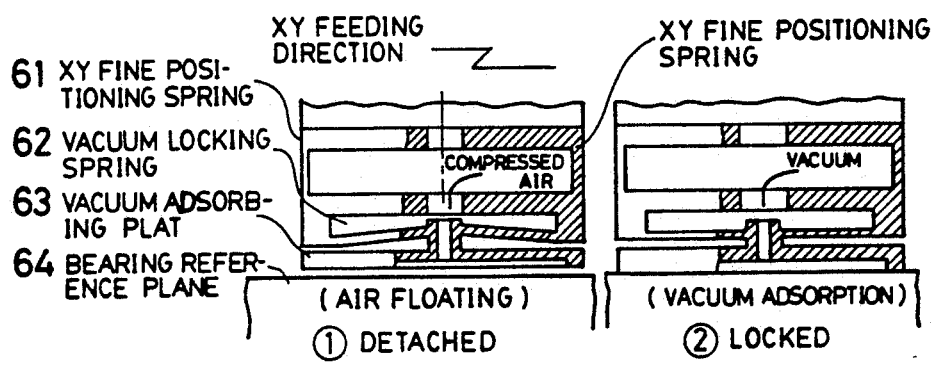
Figure 2:
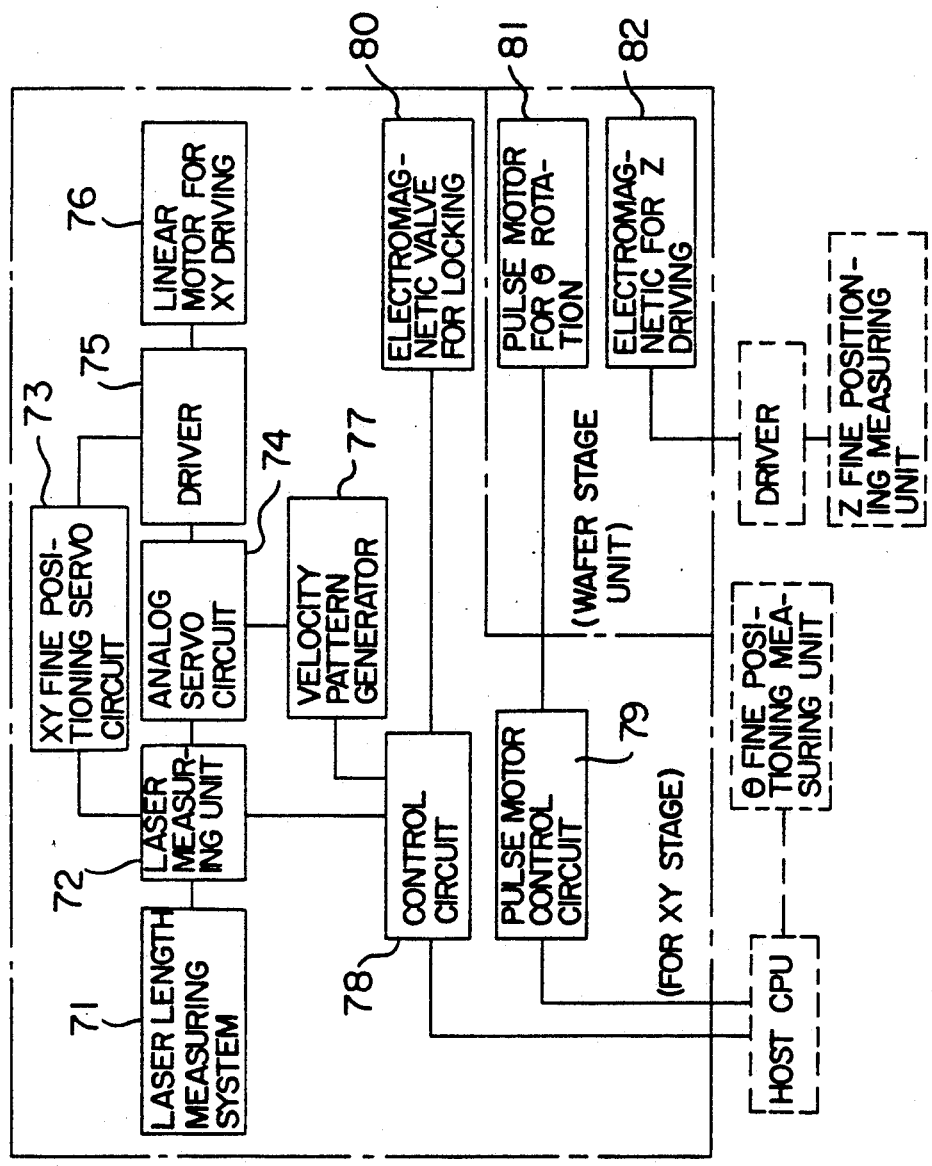
FIG. 2 is a diagram to show a conventional example of XY stage control block.
Figure 3:
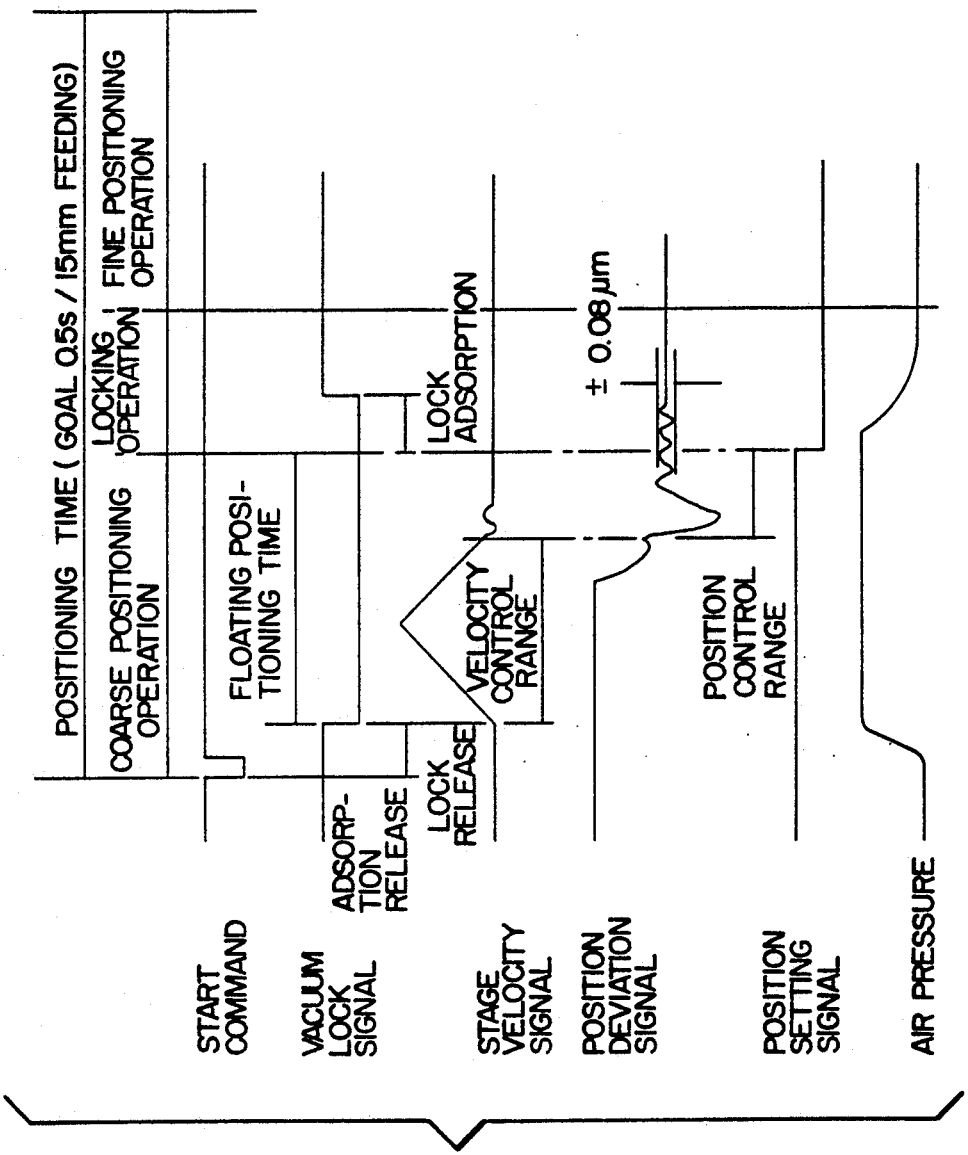
FIG. 3 is a diagram giving an example of positioning sequence.
Figure 4:
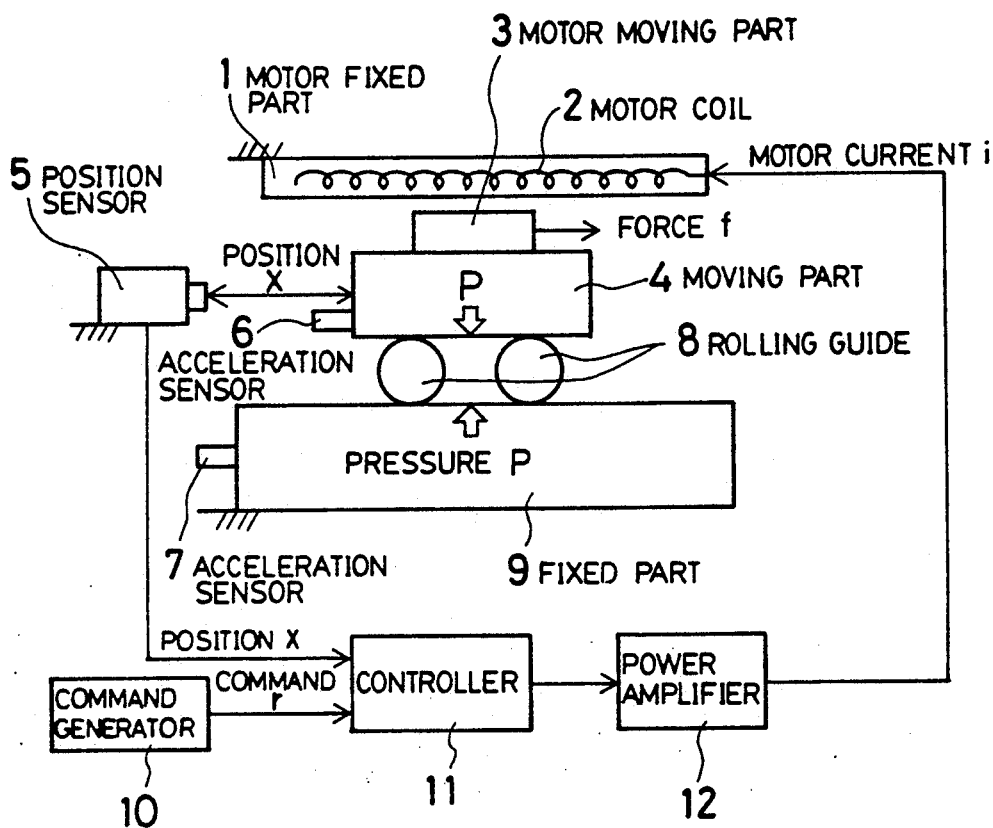
FIG. 4 is a drawing to represent an embodiment of an ultra-precision positioning system according to this invention.

In FIG. 4, 1 refers to a motor fixed part, 2 a motor coil, 3 a motor moving part, 4 a moving part, 5 a position sensor, 6 and 7 acceleration sensors, 8 a rolling guide, 9 a fixed part, 10 a position reference generator, 11 a controller, and 12 a power amplifier. The moving part 4, the fixed part 9 and the rolling guide 8 make up the mechanism element of the ultra-precise positioning system. By supporting the moving part 4 to control the position by the rolling guide 8, by holding the rolling guide 8 between the moving part 4 and the fixed part 9 and by applying pressure, the rollers or the balls of the rolling guide are elastically deformed to the pressure direction and to the driving direction perpendicular to it, and relative movement is obtained between the rolling guide and the fixed part 9. For this movement, the driving force f is generated on the moving part 4 by the non-contact motor consisting of a motor fixed part 1 and a motor moving part 3 by mounting the motor moving part 3 on the moving part 4. The position sensor 5 is to detect the displacement x of the moving part 4 for position control, and the generator 10 generates the position reference r of the moving part 4. The controller 11 compares the measured position x of the moving part 4 with the position reference r, controls the driving force f by controlling the motor current i of the motor coil 2 through the power amplifier 12 and performs position control of the moving part 4. The acceleration sensor 6 detects the acceleration of the moving part 4 in the driving direction, while the acceleration sensor 7 detects the acceleration of the fixed part 9 in the driving direction.

Figure 5:
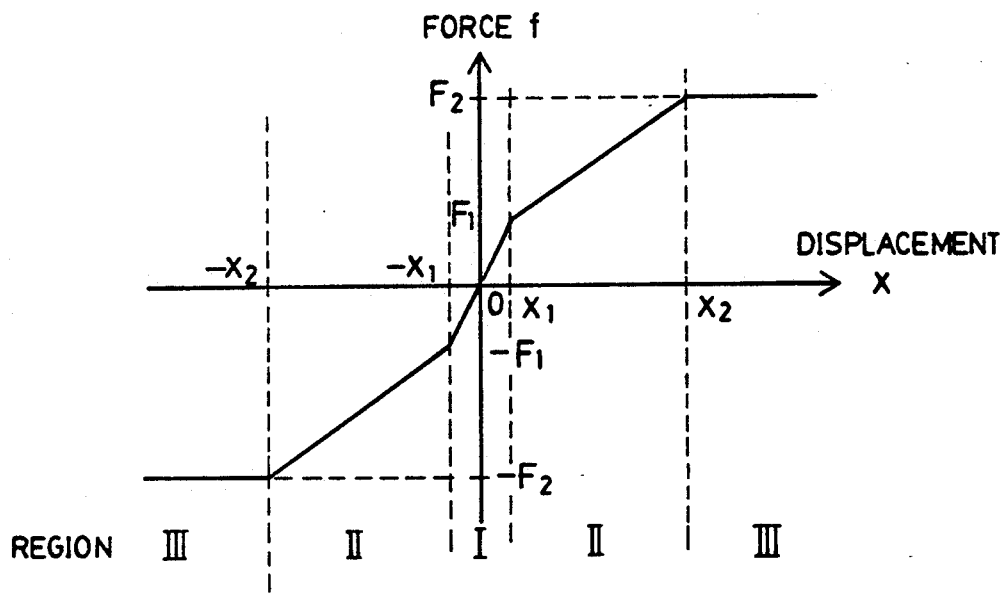
FIG. 5 is a diagram to show the displacement-force relation of the rolling guide.

When pressure is applied as described above, elastic contact according to Herz's contact occurs on the rolling body, which consists of rollers and balls of the rolling guide 8. When driving force f is generated on the motor moving part 3 and the moving part 4 after the rolling guide is stopped at an equilibrium position, the static relationship between the displacement x and the driving force f is measured by displacing the moving part 4, the characteristics consisting of the regions I–III as shown in FIG. 5 are obtained. The existence of the regions I and II has been found by the present inventors for the first time.

The conventional type rolling guide utilizes the region III, whereas high-velocity and ultra-precise positioning is provided by the ultra-precise positioning system of this invention by combining and utilizing the regions III and II or regions III, II and I.

Figure 6:
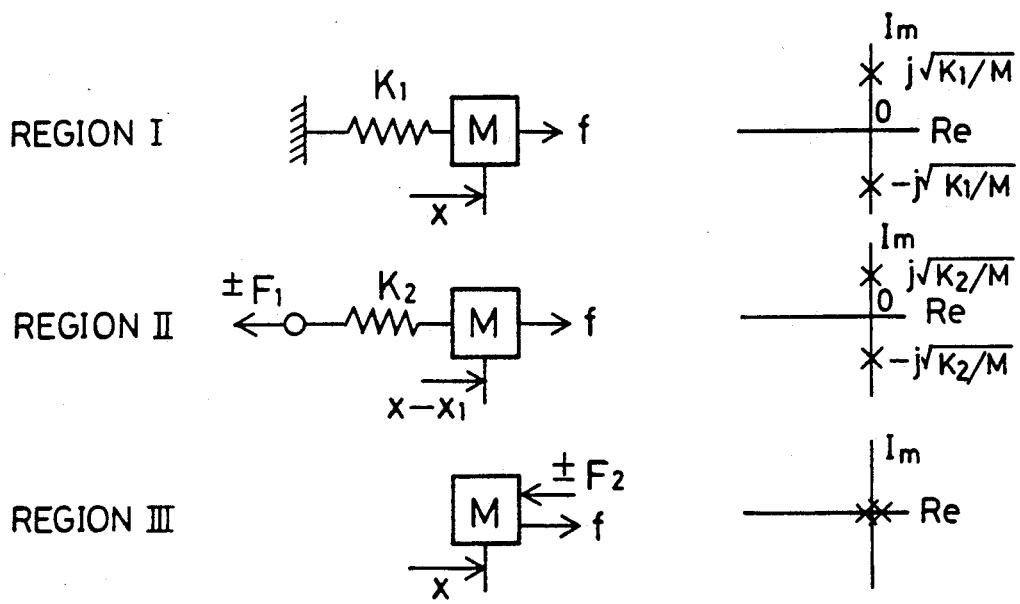
FIG. 6 is a drawing to show the dynamic model in each region of the rolling guide.

Before explaining the positioning control system, description will be given first on the characteristics of each region. The regions I–III are represented by the dynamic models as given in FIG. 6, and the displacement-force characteristics in each of these regions are described below when the equilibrium position at f=0 is set x=0 and it is regarded as the origin O.

(1) The region I ($|x| < x_1$) is the region where the moving part 4 is connected the fixed part 9 through the spring characteristics of the guide. Therefore, it is a system where the mass M and the spring $K_1$ are connected in series as given by the region I of FIG. 6. This system is naturally linear and has positional property, and a normal rolling does not occur. Accordingly, it has linear characteristics passing through the origin O, i.e. spring characteristics. Because the linearity of the spring characteristics of this region is very good and its natural frequency is high, nanometer positioning can be achieved by utilizing such characteristics.

The transfer function from the force f to the displacement x in this region is:

$$G_1(s) = \frac{1}{Ms^2 + K_1}$$

and the natural angular frequency is $$\omega_{n1} = \sqrt{K_1/M} \ .$$

On the frequency plane, this characteristics are expressed as poles on an imaginary axis. In the device on trial production as described later, $$x_1 \approx 10-100 \text{ nm}$$

$$M \approx 5 \text{ kg}$$

$$K_1 \approx 10-20 \times 10^6 \text{ N/m}$$

and $$f_n = \omega_n/2\pi \approx 200-300 \text{ Hz}$$

The characteristics of this region correspond to the conventional fine positioning mechanism, but the natural frequency is about 4-10 times as high as that of the conventional fine positioning mechanism.

(2) The region II ($x_1 \leq |x| < x_2$) is the region where the contact portion of the rolling guide is partially fixed and the remaining portion is in sliding condition. In this region, rolling movement occurs when a constant force is continuously applied. The relationship between force and displacement is not steady, and irreversible movement with energy loss due to hysteresis friction occurs. Therefore, when the control is performed with constant displacement, force is a function of displacement, and it is approximately regarded as spring characteristics as shown in the region II of FIG. 6. Namely, it is approximated as a straight line, but this straight line does not go through the origin O. Accordingly, the linearity of the spring characteristics of this region is not very good but it has high repeatability. Because almost the same characteristics are provided to an arbitrary position, this can be effectively utilized for position control.

The behavior in this region II can be approximately expressed as:

$$M\ddot{x} + K_2(x - x_1) = f \pm F_1$$

If this is changed to:

$$M\ddot{x} + K_2 x = f \pm F_1 + K_2 x_1$$

and if the right side including friction force is considered as driving force, the transfer function from the driving force to the position is:

$$G_2(s) = \frac{1}{Ms^2 + K_2}$$

and natural angular frequency is:

$$\omega_{n2} = \sqrt{K_2/M}$$

On the experimented system:

$$x_2 \approx 100 \text{ }\mu\text{m}$$

$$K_2 \approx 1-0.1 \text{ N/m}$$

The spring constant $K_2$ is smaller by one-tenth to one-hundredth of the spring constant $K_1$ of the region I. Accordingly, the natural frequency is also decreased to about ⅓-1/10.

This region has the intermediate property between conventional coarse positioning system and fine positioning system.

(3) The region III (x $x_2$) is the region where normal rolling occurs with the staturated friction force. It is the region where force, i.e. friction force, is almost constant not depending on the displacement. This friction force is same as the so-called coulomb friction as shown in the region III of FIG. 6. Because the displacement in this region is more than 100 μm from the equilibrium position, almost all movements in case of long stroke operation are done in this region.

The behavior in the region III is expressed as:

$$M\ddot{x} = f \pm F_2$$

In the movement of rigid body where friction force is applied, the transfer function from force to position is:

$$G_3(s) = 1/Ms^2$$

Usually, it is considered that the rolling guide system has the characteristics of this region, and the position control system using the conventional rolling guide is designed by assuming the characteristics of this region. Therefore, in the position control system using the conventional rolling guide, the characteristics of the regions I and II are not positively utilized.

Next, description will be given on the control system of the ultra-precise positioning system having the above mentioned mechanical properties.

In the ultra-precise positioning system of this invention, the characteristics of the above regions I-III on the rolling guide are effectively utilized to achieve the ultra-precise and high speed positioning. Actually, the moving part 4 is driven to the position near the reference position using the region III for the long stroke positioning. After the driving force is released near the reference position and the integral control is reset, it is shifted to the regions II and I to achieve ultra-precise positioning.

For short stroke positioning from the equilibrium position, i.e. from the start position in the region I, to the reference position within the regions I and II, the characteristics of the regions I and II are utilized.

However, in case of long stroke positioning beyond the region II, control is performed, considering that, upon entering the region III, it does not return to the regions I and II until it is stopped. An example of such control is explained in connection with FIG. 7.

Figure 7:
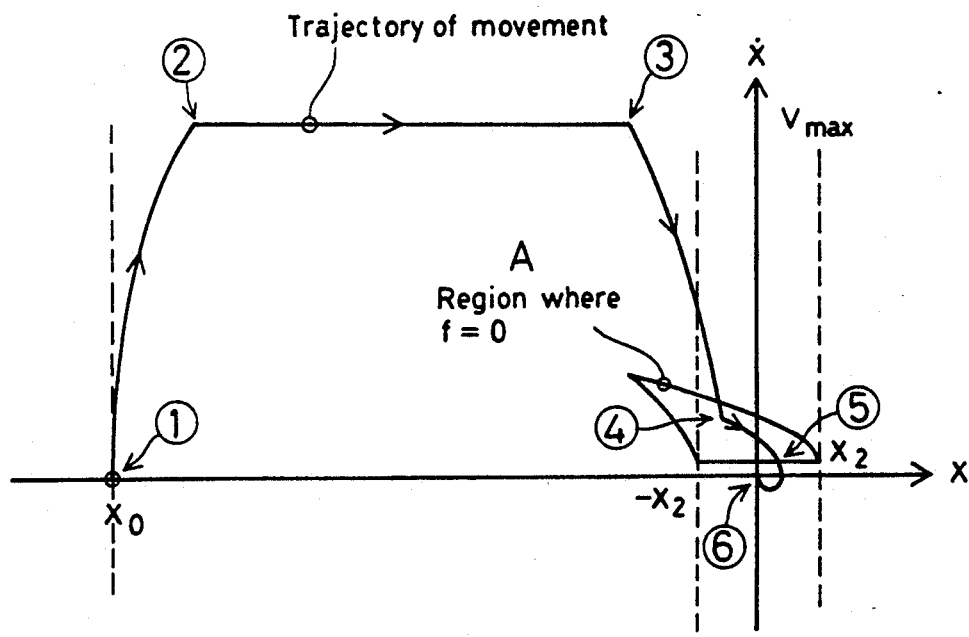
FIG. 7 is a drawing to explain the long stroke positioning control procedure.

As shown in FIG. 7, the first stopping position is $x_0$ (<0), and a positioning to the origin (x, ẋ) =(0, 0) is considered without generality. First, the command reference:

Acceleration→Constant speed→Deceleration→Stop
(Positioning)

is generated as in the conventional method. In the trajectory of the phase plane of FIG. 7, acceleration phase is (1)→(2), constant velocity phase is (2)→(3), and deceleration phase is (3)→(4). This movement is carried out in the region III, and the structure of the control system is the same as the conventional system. Considering the deformation of the rolling guide, command is amended to:

$$r' = \begin{cases} r + \Delta & \text{if } Xr > 0 \\ r - \Delta & \text{if } Xr < 0 \end{cases}$$

in the region III, and to $$r' = r$$

in the regions I and II.

Further, the control different from the conventional system is performed from the next step according to this invention.

Specifically, the region A near the reference position as shown in FIG. 7 is set and within this region the control force f is forced to zero. At the moment when the trajectory enters in this region (the point (4) in the figure) during the deceleration, the driving force is set to 0 and the integral control is forcibly reset. When the driving force is set to zero, the moving part is decelerated by the friction force $-F_2$, and the velocity is decreased to zero, i.e. it is stopped. At this moment, the behavior of the guide mechanism is shifted to the region II or I from the region III. From the moment (the point (5) in the figure) when the velocity is decreased to almost zero with zero driving force, the control of the regions II and I is activated, and the final positioning is performed.

In case of the negative direction positioning, i.e. in case $x_0 > 0$, only the direction is reversed. Namely, according to this invention, the driving force is turned to zero during the positioning, and the behavior of the rolling guide is shifted from the region III to the regions I and II. By effectively utilizing the spring characteristics of the rolling guide with high rigidity and linearity, ultra-precise positioning unachievable in the past is now accomplished.

Figure 8A:
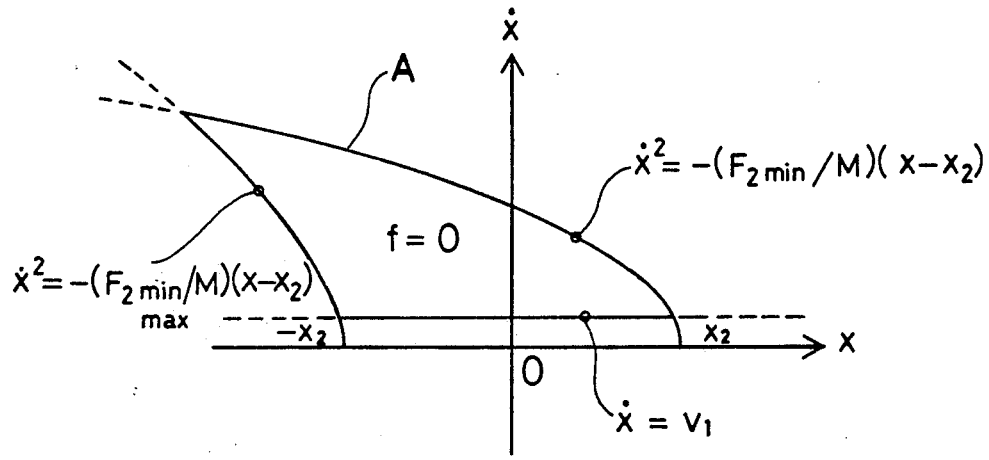
FIGS. 8(a)–8(f) are diagrams to explain the region where operating force is turned to zero.
Figure 8B:
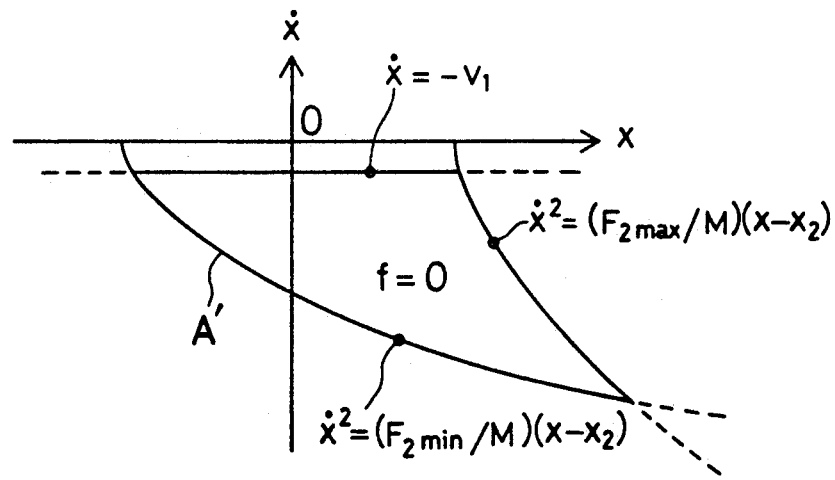
Figure 8C:
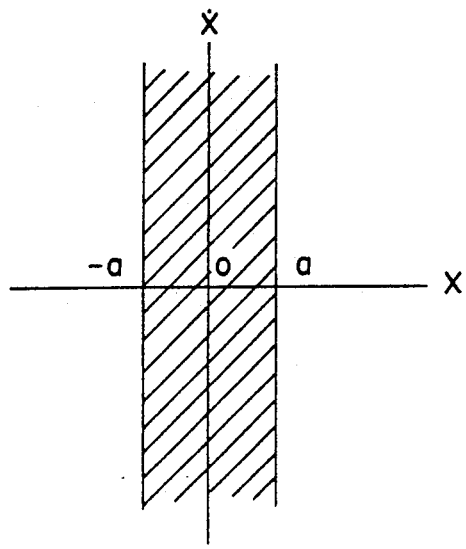
Figure 8D:
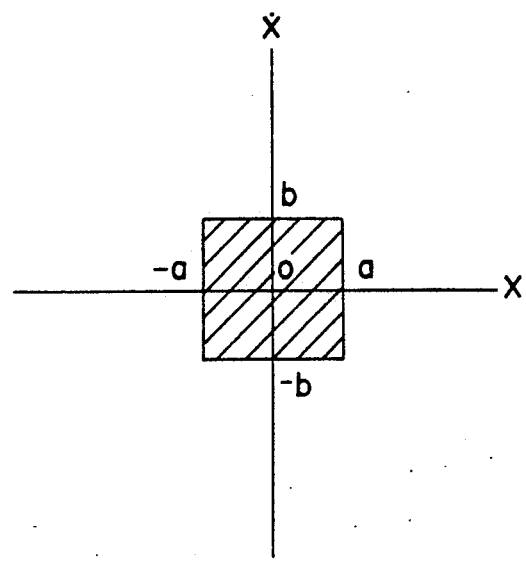
Figure 8E:
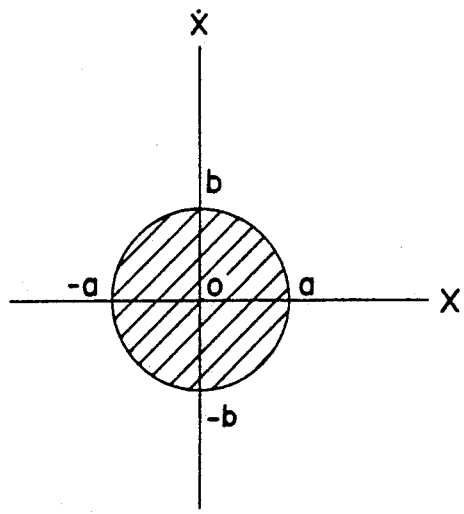
Figure 8F:
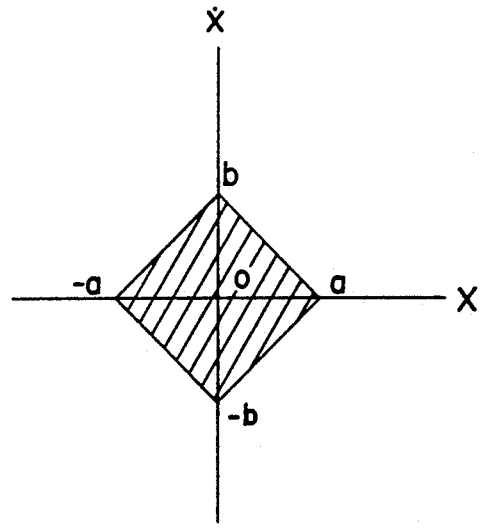

Therefore, the region A where the driving force is turned to zero is set in such a manner that it is stopped within the range of $|x| \leq x_2$ with the friction force only, and the region is formed, which is enclosed by three curves of:

$$\dot{x}^2 = -(F_{2min}/M)(x-x_2)$$

$$\dot{x}^2 = -(F_{2max}/M)(x+x_2)$$

$$\dot{x} = v_1$$

as shown in FIG. 8(a) in case of the negative direction positioning, and $$\dot{x}^2 = (F_{2min}/M)(x-x_2)$$

$$\dot{x}^2 = (F_{2max}/M)(x+x_2)$$

$$\dot{x} = -v_1$$

as shown in FIG. 8(b) in case of the positioning toward negative direction. Here, $F_{2max}$ and $F_{2min}$ are maximum value and minimum value of the friction force $F_2$, and $V_1$ is a velocity close to zero. This region can be replaced by the regions with easier calculation as given in FIG. 8(c)-(f).

Next, description will be given to the structure of the control system of each of the above regions.

Figure 9:
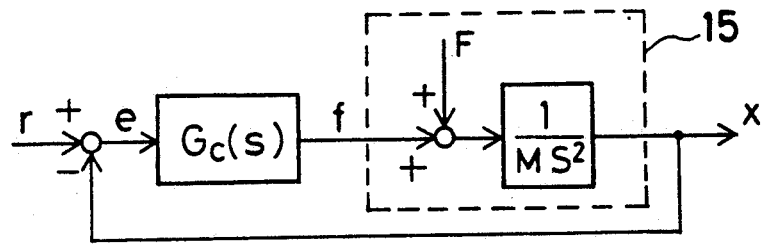
FIG. 9 shows the composition of a control system in the region III.
Figure 10A:
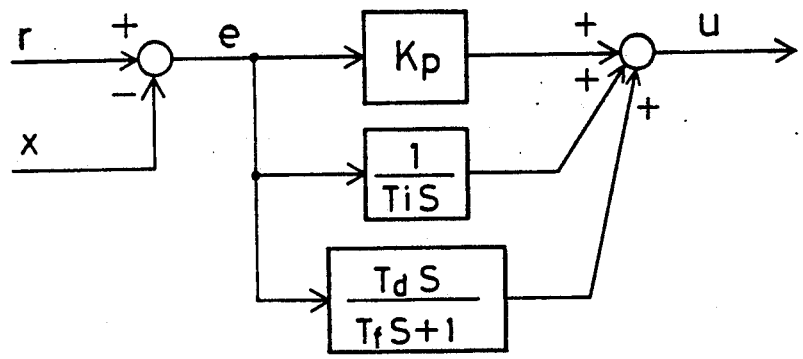
FIGS. 10(a) and 10(b) are diagrams to explain an example of the control method of the rigid system (region III)
Figure 10B:
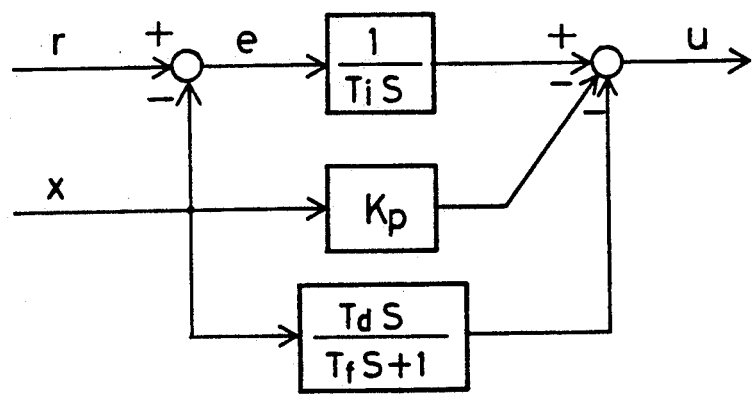

In the conventional control method, a rigid body system is designed to have the desired quick response and damping. Since the characteristics of the region III are the same as a rigid body system, the block diagram is given by FIG. 9, where broken line 15 shows the characteristics of the mechanism. FIG. 10 shows an example of this region III, i.e. an example of conventional control system of the rigid body system. FIG. 10(a) shows PID control, and FIG. 10(b) I-PD control.

In both figures, it is assumed that only the position can be measured. For the purpose of eliminating the offset by friction force, integral control is added. Differentiation is operated by an approximate differential circuit. The differential control gives an important effect on the stability of the control system, and this is equivalent to the velocity feedback. If velocity can be directly measured, differential control can be replaced by a velocity feedback. The symbols are:

$K_p$: Proportional gain $T_i$: Integration time ($T_i^{-1}$: Integration gain)

$T_d$: Differential time (differential gain)

$T_f$: Time constant of approximate differential circuit

Figure 11:
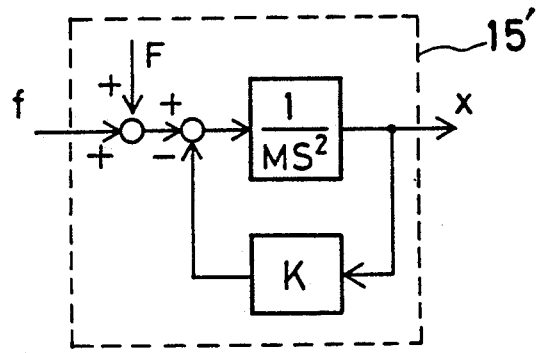
FIG. 11 is a diagram to show the property of the object to be controlled in the regions I and II.
Figure 12:
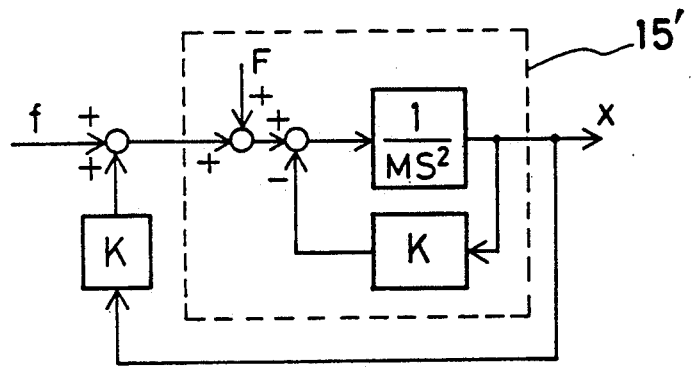
FIG. 12 shows a positive feedback loop of the position to make the response equivalent to the characteristics of the region III.

On the other hand, the characteristics of mechanism in the regions I and II can be expressed as given in FIG. 11. The difference from the rigid body system of FIG. 9 is that there is the feedback of spring constant K. Accordingly, by adding positive feedback of gain K artificially as shown in FIG. 12, it is possible to make the characteristics of the mechanism of the regions I and II to be identical to the characteristics in the rigid body system of the region III.

Figure 13:
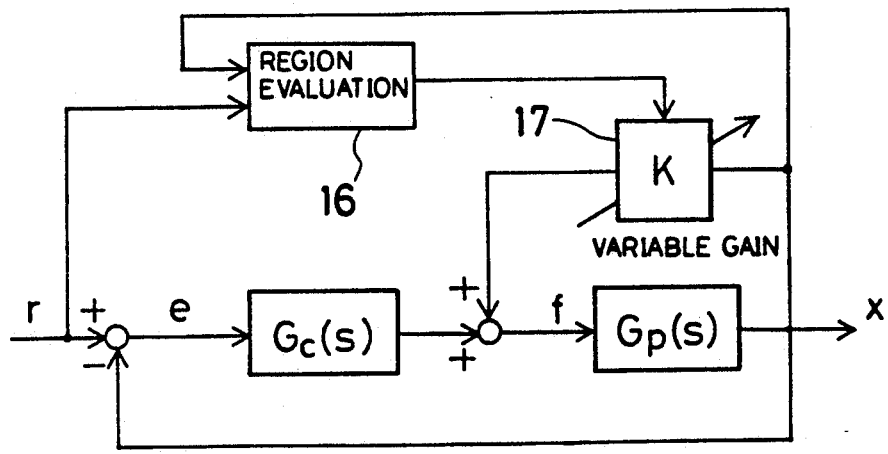
FIG. 13 is a diagram to show the configuration of a control system having the same characteristics in all regions.

If the above positive feedback is utilized, the closed loop characteristics in all regions can be equalized, and FIG. 13 shows such arrangement. This is the structure obtained by adding positive feedback of variable gain 17 to the structure of FIG. 9. By the region classification 16, the variable gain 17 is set to:

Region I: $K = K_1$

Region II: $K = K_2$

Region III: $K = 0$

Figure 14:
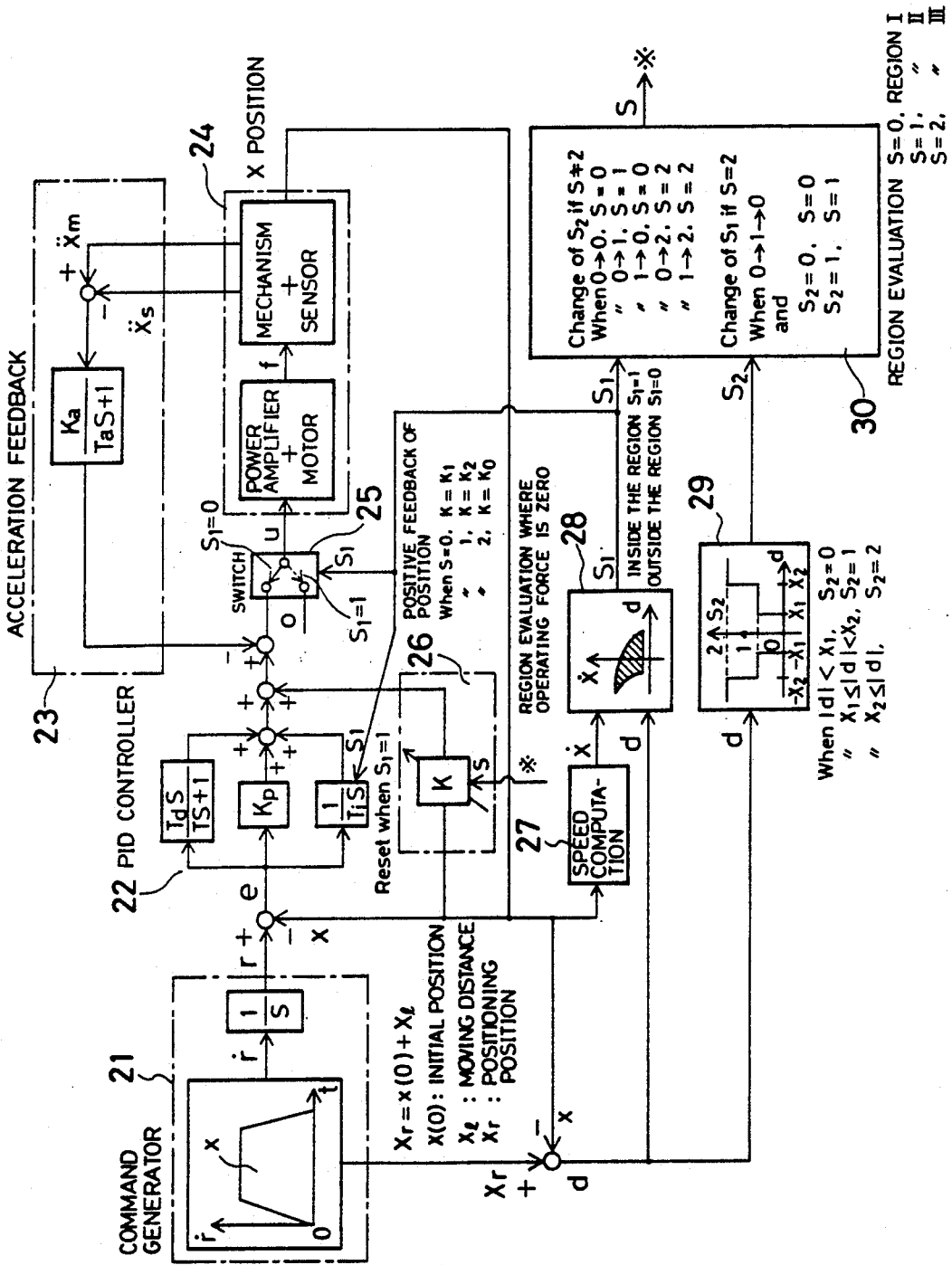
FIG. 14 is a diagram of an example of the configuration of the entire control system.

FIG. 14 shows an example of the structure of the entire control system. Here, 21 denotes a command reference generator, 22 a PID controller, 23 an acceleration feedback circuit, 24 a control object, 25 a switch, 26 positive feedback of position, 27 a velocity arithmetic circuit, and 28, 29 and 30 region classification circuits.

In FIG. 14, the command reference generator 21 generates the position command signal. The error between this position command signal r and the position signal x is inputted into PID controller 22. The output of PID controller 22 is turned to the driving signal u of the mechanism element 24 through the switching circuit 25. Here, position positive feedback circuit 26 and acceleration feedback circuit 23 are connected. The acceleration feedback circuit 23 feeds back relative acceleration of the driving direction by subtracting the signal of the acceleration sensors 7 from 6 of FIG. 4. The position positive feedback circuit 26 is a feedback circuit of variable gain K relating to the regions I-III as explained in FIG. 13. The region classification circuits 28-30 30 reset the integral control of PID controller 22 relating to the regions I-III or generate the signals to switch the control in the region near the reference position.

The region classification circuit 28 is a circuit for region classification when the driving force is set to zero forcibly near the reference as explained in FIGS. 7 and 8. In case of the region A shown in FIG. 8 where driving force is set to zero, the classification signal "1" is outputted. In other cases, the classification signal of "0" is outputted. Therefore, in case the classification signal $s_1$ is "1", the switch circuit 25 is set to "open" side, and the input of power amplifier of the control object 24 (driving signal u) is forcibly set to zero, and the integral control of PID controller 22 is reset.

The region classification circuit 29 is a circuit to classify the regions I-III for the deviation d of the positioning position $X_r$ and the displacement x. In case the deviation d is in the region I, the classification signal $s_2$ of "0" outputted. In case it is in the region II, "1" is outputted, and in case it is in the region III, "2" is outputted.

The region classification circuit 30 is a circuit for region classification to set positive feedback gain of position. In case it is classified as the region I from the classification signal $s_1$ of the region classification circuit 28 and from the classification signal $s_2$ of the region classification circuit 29, the classification signal s of "0" is outputted. In case it is classified as the region II, "1" is outputted, and "2" is outputted when classified as the region III. Therefore, the gain K of positive feedback circuit 26 is set to $K_1$ when the classification signal s is "0". It is set to $K_2$ when classification signal s is "1", and to 0 when classification signal s is "2".

Figure 15A:
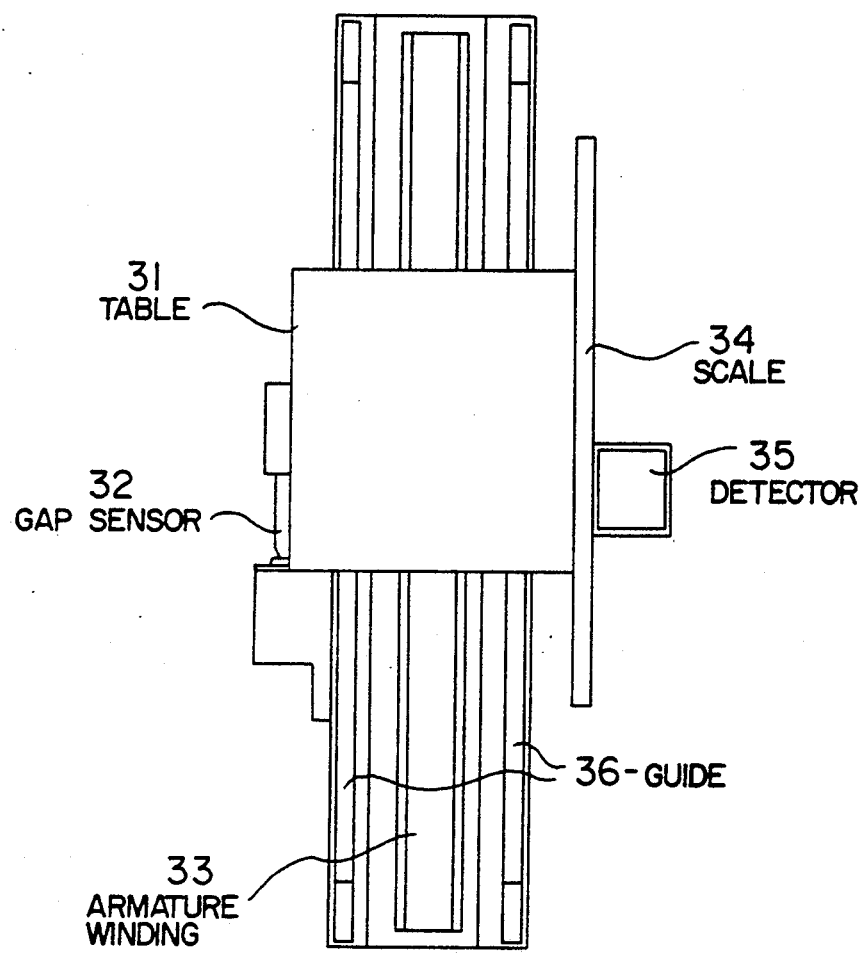
FIGS. 15(a) and 15(b) are drawings to show the examples of the configuration of the mechanism (unit), the motor and the sensors of ultra-fine positioning system according to the present invention.
Figure 15B:
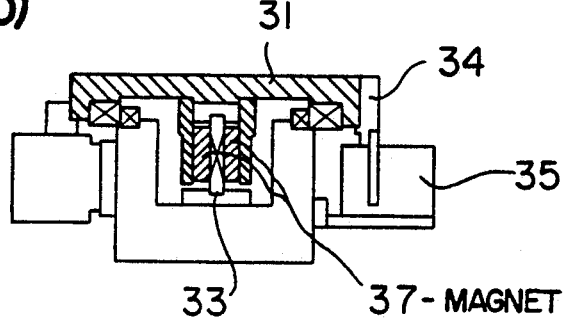

FIG. 15 shows an example of structure the mechanism and the motor of the ultra-precise positioning system under experiment. The guiding system is a rolling type linear guide using balls. On the base of the fixed part guide rails 36 is mounted, and the moving parts of guide is fixed on four corners of the table 31. The guide is pushed by the screw mounted on the table 31, and pressure is applied on the balls.

The motor is an AC linear motor of moving magnet type. Three-phase armature windings 33 is solidified with resin and is fixed on the base. Permanent magnets 37 are fixed under the bottom of the table 31. When electric currents are driven to armature winding 33, driving force is generated on the table 31. The motor is located at the center of the mechanism. If permanent magnets 37 are located as shown in FIG. 15, a moment force is not applied on the moving part. If coreless type winding, the fluctuations of driving force due to irregularity of magnetic circuit can be eliminated. Because the inductance of winding is extremely decreased at the same time, the motor with small electric constant and with high response can be obtained.

In this driving system, if winding resistance is R = 20 $\Omega$ and the inductance L = 1 mH, the electric time constant T is given by:

$$T = L/R = 1 \text{ mH}/20 \text{ }\Omega = 50 \text{ }\mu S.$$

The frequency response of the motor current when driven by linear amplifier is 10 kHz or more with the gain at $-3$ dB. Furthermore, it was confirmed that the resolution of force was better than 1 mN.

Figure 16:
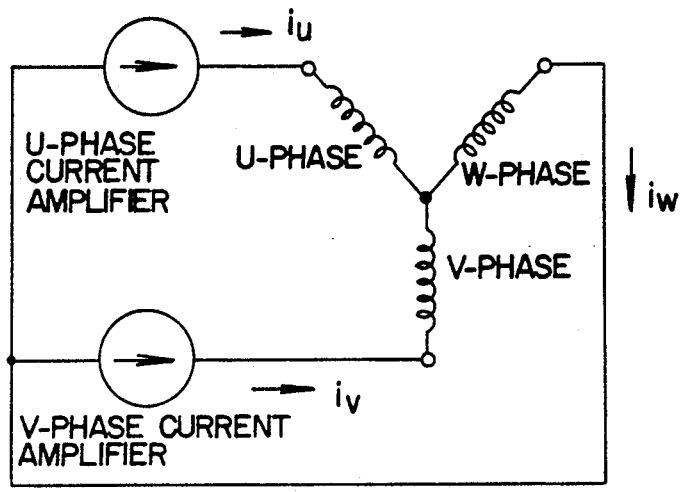
FIG. 16 gives an example of the current driving method of AC motor winding (5)

As shown in FIG. 16, 3-phase armature windings of the motor was connected as star connection, and u-phase and v-phase were driven by two linear current power amplifiers. By this connection, the equilibrium condition of 3-phase currents:

$$i_u + i_v + i_w = 0$$

is automatically obtained. The vector control is performed for $i_u$ and $i_v$ in such a manner that the magnetic field vector and the current vector are orthogonal to each other.

One of the problems of fine position control in the regions I and II is the difficulty to obtain a velocity signal by differential calculation of the position because the position signal is very small, and the stability and the damping of the control system cannot be increased.

FIGS. 17 and 18 represent the examples of the solutions to this problem.

The first is the method to stabilize by acceleration feedback. In the regions I and II, the mechanism has the vibration characteristics with high natural frequency. The vibration displacement with amplitude a is expressed as:

$$x(t) = a \sin (2\pi f_n t)$$

and the acceleration of this movement is given by:

$$\ddot{x}(t) = a (2\pi f_n)^2 \sin (2\pi f_n t)$$

Figure 17A:
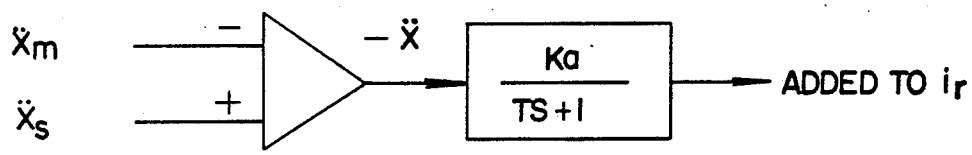
FIGS. 17(a)–17(c) are diagrams to explain an example of stabilization of the control system by acceleration feedback.

Here, because $$(2\pi f_n)^2 > 1,$$

the acceleration is measured by a signal with relatively high level. Furthermore, vibration signals can be processed by AC circuits. The acceleration of the moving part and the fixed part are independently measured by piezoelectric type acceleration sensors, and the difference between them is calculated as shown in FIG. 17(a). The relative acceleration is then obtained. By adding this to the current command through a first-order lag circuit, the acceleration feedback is obtained. T is the time constant of the first-order lag circuit, and $K_a$ is the acceleration feedback gain.

The transfer function from force to acceleration is:

$$G_a(s) = \frac{s^2}{Ms^2 + K}$$

in the regions I and II, and $$G_a(s) = 1/M$$

in the region III.

Figure 17B:
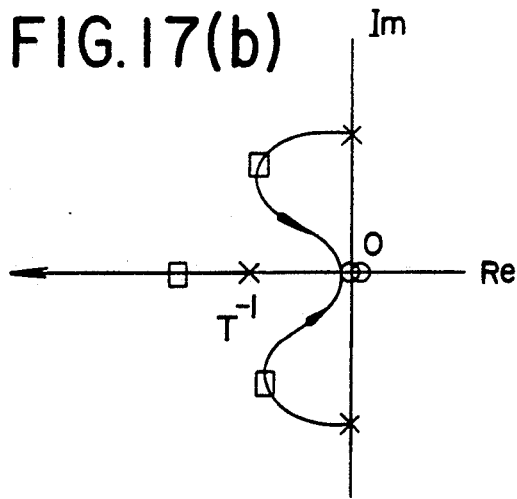
Figure 17C:
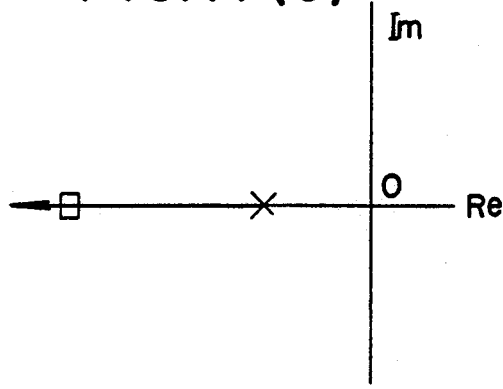

The root loci when the acceleration is feedback through a first-order lag circuit are shown in FIG. 17(b) for the regions I and II, and in FIG. 17(c) for the region III. In the regions I and II, the damping of natural vibration can be increased, and the position loop gain can be set high. Accordingly, accuracy and response of the control are increased. Because the acceleration feedback corresponds to the first-order lag with small time constant in the region III, the characteristics of closed loop show almost no change.

Figure 18A:
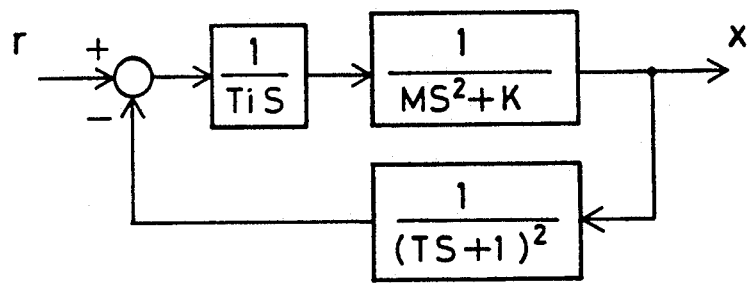
FIGS. 18(a) and 18(b) are diagrams to explain an example of stabilization of the control in the region I by an integral control and a second-order lag filter.
Figure 18B:
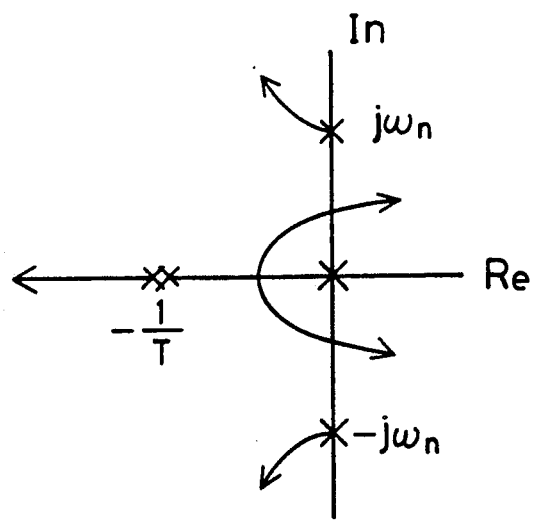

The second method to stabilize the position control is by utilizing that the mechanism has with vibration characteristics in the regions I and II. Namely, as shown in FIG. 18(a), control is performed only by simple integral control, and position feedback is performed through a second-order lag filter. For the natural angular frequency of $\omega_n = \sqrt{K/M}$ of mechanism, the time constant of second-order lag filter is set to about $T \approx 1.5 \omega_n^{-1}$. Then, the vibration characteristics can be stabilized with the increase of integration gain $T_i^{-1}$ as shown in the root loci of FIG. 18(b). Thus, it is possible to make the closed loop position control system with high gain and response and without offset. Because the structure of this control method is unstable in the region III, the classification of the regions is performed. This structure is used only in the regions I and II. Further, $$T = 1.5 \omega_{n1}^{-1}, T_i^{-1} = 0.2 \omega_{n1}^{-1}$$

are set in the region I, and $$T = 1.5\, \omega_{n2}^{-1},\ T_i^{-1} = 0.2\, \omega_{n2}^{-1}$$

are set in the region II.

The present invention is not limited to the above description, and it is possible to make various variations and modification. For example, the examples of mechanism and motor are shown on the experimental system in the above description, while there are various variation for the positioning mechanism, which is driven by non-contact motor and is contact only with the rolling guide.

In the following, description will be given on another explanation of this invention.

Figure 21:
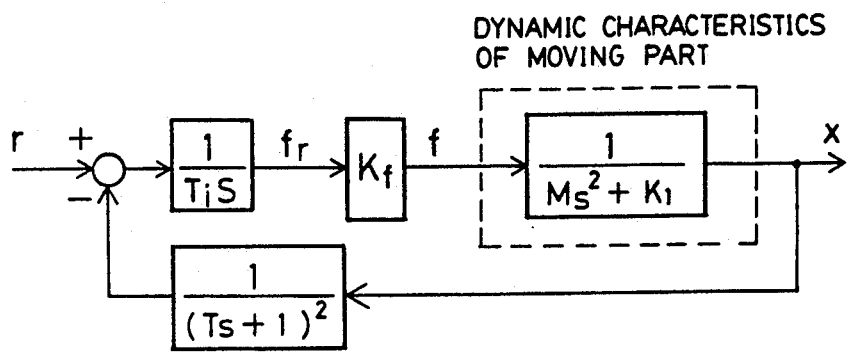
FIG. 21 shows the configuration of fine positioning controller.
Figure 22:
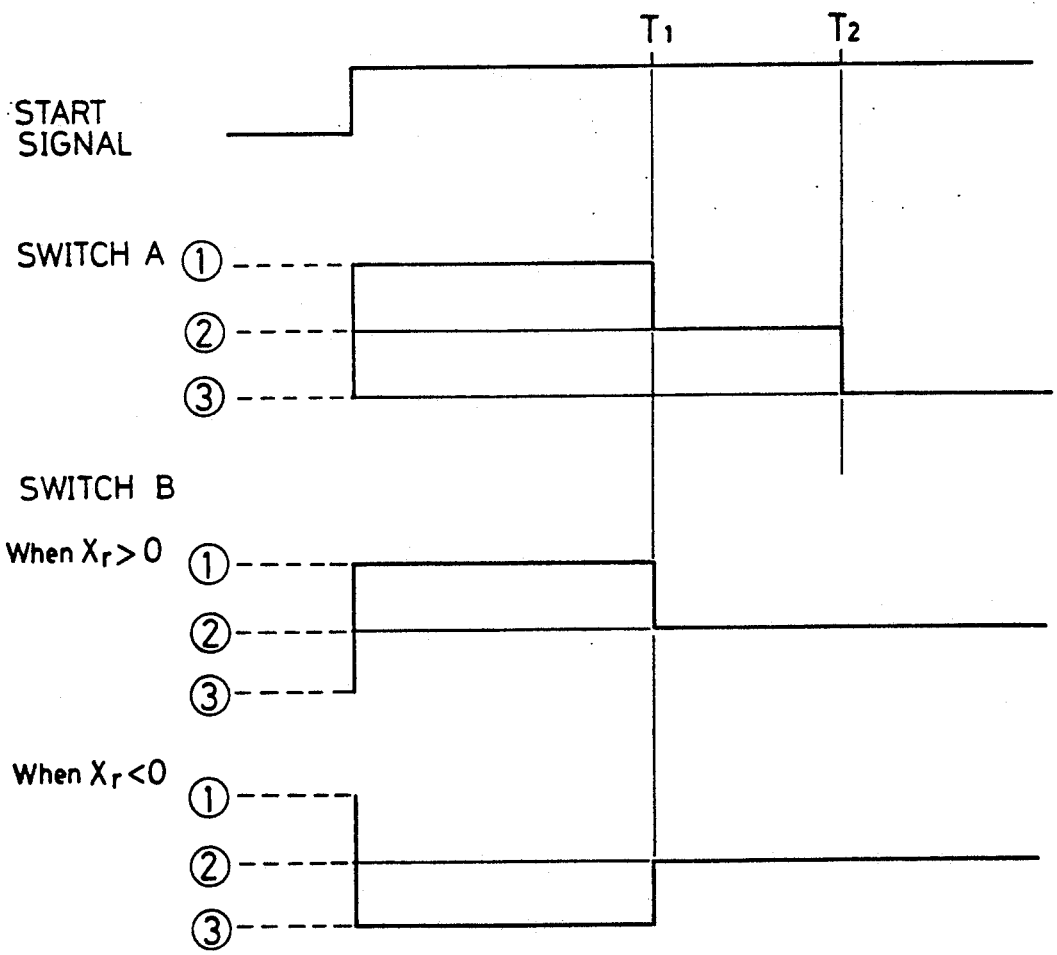
FIG. 22 represents the time chart of a switch to change over between the motor ON/OFF signal and the input of power amplifier, the switching sequence of the switch A and B.
Figure 23:
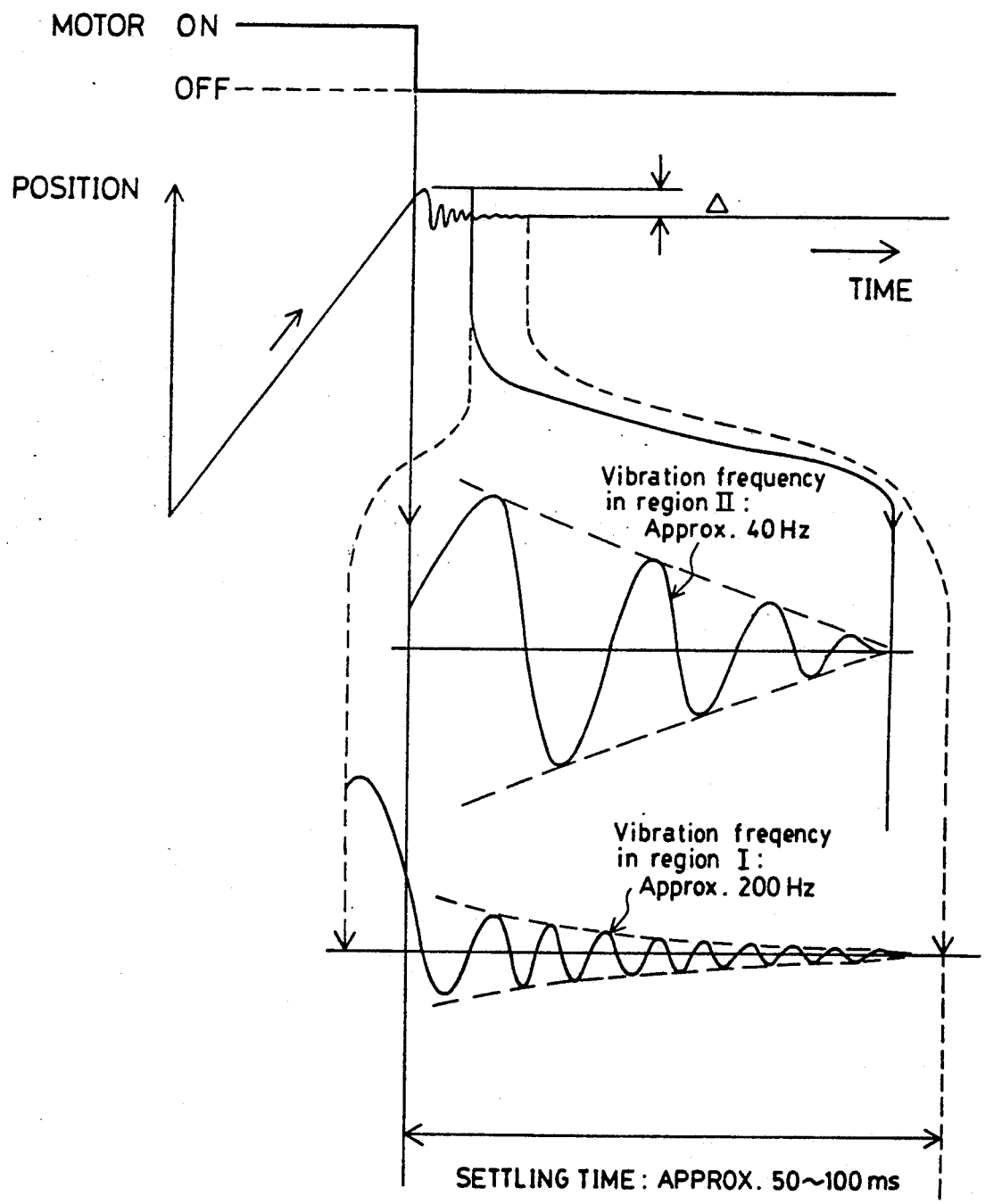
FIG. 23 shows the experimented transient response of behavior of the moving part after the time $T_1$ when the motor is turned off.

FIG. 19 is a diagram to show the Embodiment 2 of the ultra-precise positioning system according to the present invention, FIG. 20 is the block diagram of the coarse positioning control, FIG. 21 gives the configuration of the fine positioning control, FIG. 22 is the time chart of switch A and B, and FIG. 23 is the measured response of the moving part after the time $T_1$ when the motor is turned off.

Unlike the formerly mentioned structure of this invention, three independent controllers are designed for each three regions I, II and III, and the switches are used to select the outputs of the three controllers by the result of the region classification. The Embodiment 2 is given in FIG. 19. This method confirmed by experiment. FIG. 19 differs from FIG. 14 in the following points:

(1) Acceleration feedback is not performed.
(2) Two independent controllers, i.e. coarse positioning controller 91 and fine positioning controller 92 are designed.
(3) Two position sensors, i.e. the position sensor 94 for coarse positioning and the position sensor 95 for fine positioning, are used.
(4) The control is switched not by strict status but by the time control sequence, using the status classification circuit 93.
(5) When motor current is set to zero and the stage is stopped, the position goes back by the deformation $\Delta = X_2$ of the rolling guide. Taking into consideration this phenomenon, the coarse position reference is replaced with the reference position $r_c$ plus $\Delta$.

As shown in FIG. 20, the coarse positioning controller 91 is designed with the proportional position control, and portional-integral velocity control. The fine positioning controller 92 is designed as a simple integral position control without velocity loop as shown in FIG. 21. The second-order lag filter is included in the feedback loop. This control is robust against high frequency noise because only the lag elements are used.

In the operation of the switches A and B, the switch A is selected to ①  at the rising of the start signal of positioning as shown in the time chart of FIG. 22, and the switch B is selected to ① in case of the positive direction positioning, and to ② in case of the negative direction positioning. Next, the switches A and B are switched over to ② at the moment $T_1$ when the coarse position $X_c$ is equal to or is exceeded the reference position $X_r + \Delta$. Then, at the time $T_2$ after a certain period of time from $T_1$, the switch A is switched to ③. The measured response of the moving part after the time $T_1$ when the motor is turned off is shown in FIG. 23. As it is evident from this measurement, the behavior of the moving part is in the state of the region III by large stroke operation up to the time $T_1$. However, from the time $T_1$, the vibration in the region II of about 40 Hz arises and damp after about 50 ms. Then, the vibration in the region I of about 200 Hz arises and settles down after 50–100 ms. In the experiment, the time $(T_2 - T_1)$ was set to 100 ms.

Next, description will be given on the experiment related to the ultra-precise positioning system of this invention.

Figure 24:
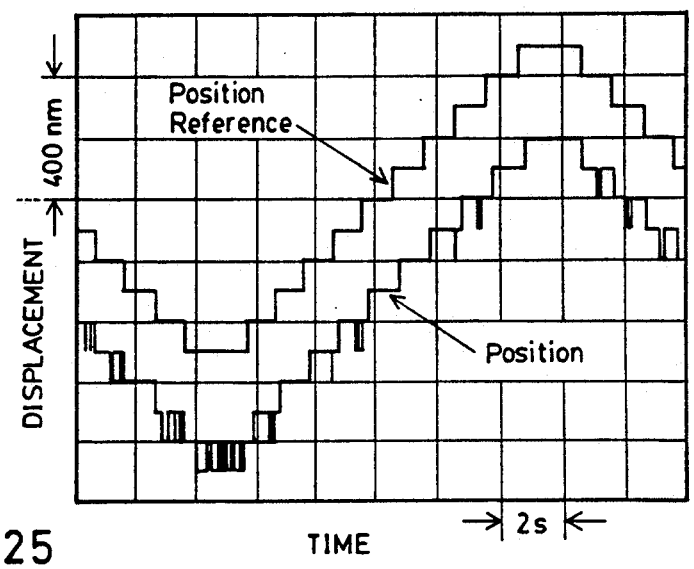
FIG. 24 shows the step response with minimum resolution of 100 nm of the coarse positioning control.
Figure 25:
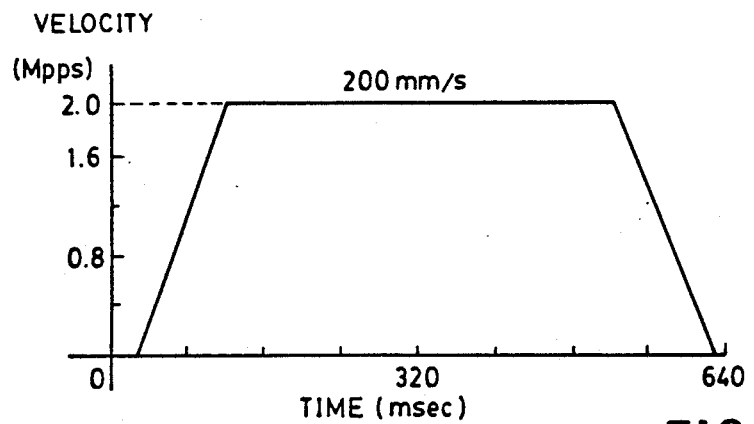
FIG. 25 shows the response of the coarse positioning at the maximum velocity of 200 mm/s.
Figure 26:
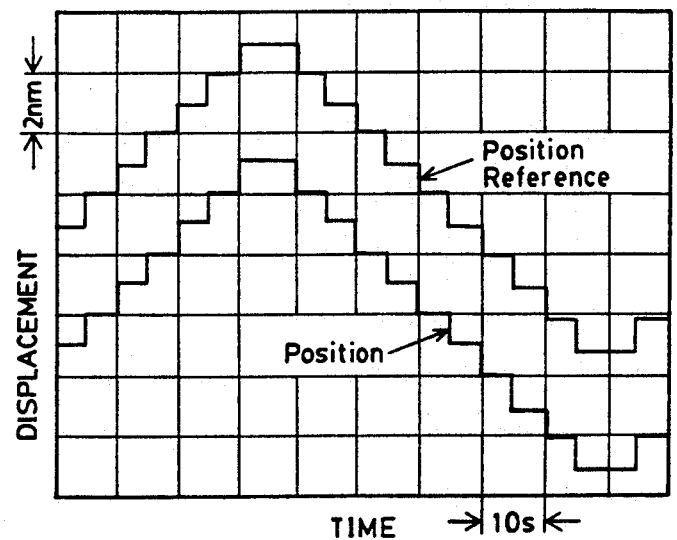
FIG. 26 is a diagram to show the step response of 1 nm of the fine positioning control.

FIG. 24 shows the step response of minimum resolution of coarse positioning control, FIG. 25 shows the response with the maximum velocity of 200 mm/s, and FIG. 26 shows the step response of 1 nm of the fine positioning control.

The minimum resolution and the maximum velocity of the coarse positioning control were determined by the performance of the coarse sensor. As it is evident from FIG. 26, the positioning with resolution of better than 1 nm without backlash could be achieved. Also, it was confirmed that, by switching from coarse positioning to fine positioning control in the sequence shown in the time chart of FIG. 22, long stroke and high speed positioning can be performed by coarse positioning control and the positioning with the resolution of better than 1 nm can be achieved by fine positioning control.

Figure 27:
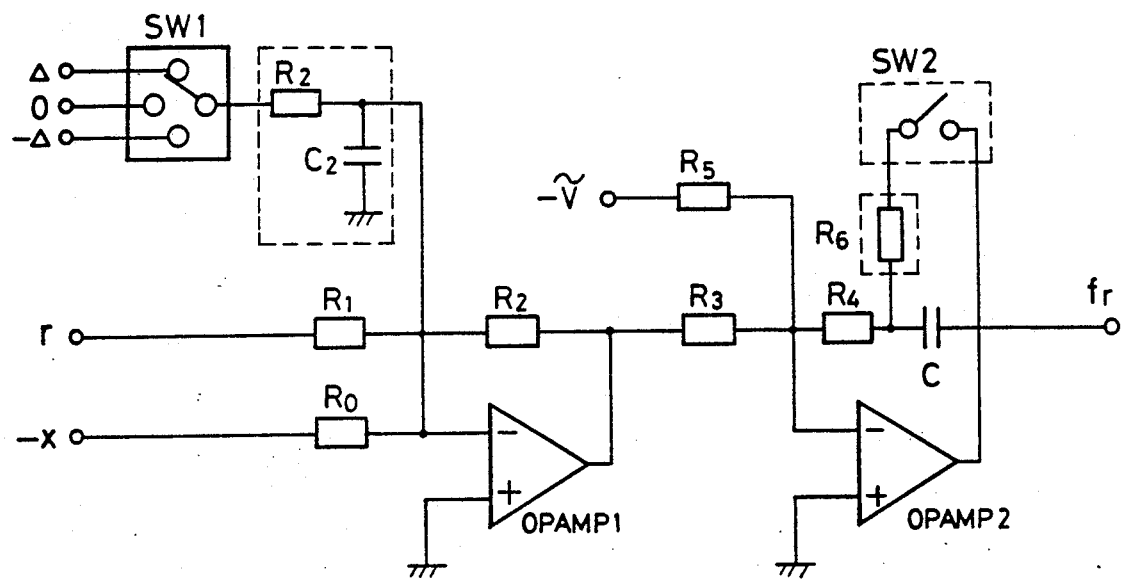
FIG. 27 is the Embodiment 3 of an ultra-precise positioning system according to this invention.
Figure 28:
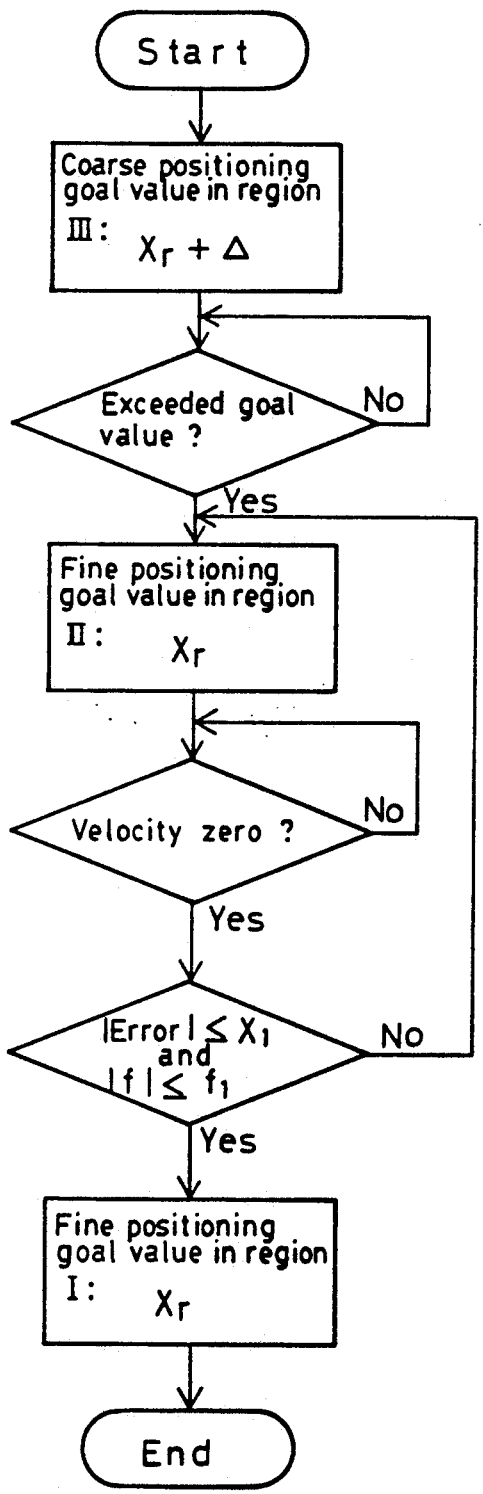
FIG. 28 is a chart to explain the positioning sequence.

FIG. 27 is a diagram to show the Embodiment 3 of the ultra-precision positioning system of this invention, and FIG. 28 is to explain the positioning sequence.

In the Embodiment 3 of this invention, the control to turn the motor off, i.e. to set the driving force to zero, and the correction of the deformation $\Delta$ of rolling guide are accomplished continuously with smooth response. A circuit to achieve the smooth switching is given in FIG. 27. This shows the control circuit for the regions III and II. The proportional position control and proportional-integral control are adopted.

The circuits added to perform smooth switching are enclosed by broken lines. Here, $R_7$ and $C_2$ make up the first-order lag circuit of the time constant $R_7 C_2$ (s), and the step change of $\pm \Delta \rightarrow 0$ is smooth change.

The voltage compensating the friction force is charged on the integration capacitor $C_1$. This capacitor is shorted by $SW_2$, and discharged through $R_6$. Thus, the force is set continuously to zero.

The range of the region I is about $\pm 100$ nm in the experimental mechanism. It is problem whether the final positioning position $x_r$ is included in the region I or not when the table settles in the region I after the positioning in the regions III and II. If it is included, it is possible to switch from the coarse positioning to the fine positioning control in the region I. If not included, however, new positioning should be performed with the positioning position $x_r$ as goal. FIG. 28 shows the sequence of such positioning.

In the above, description has been given on the positioning in a linear system, while the description can be applied also to the positioning in a rotary system.

Figure 30:
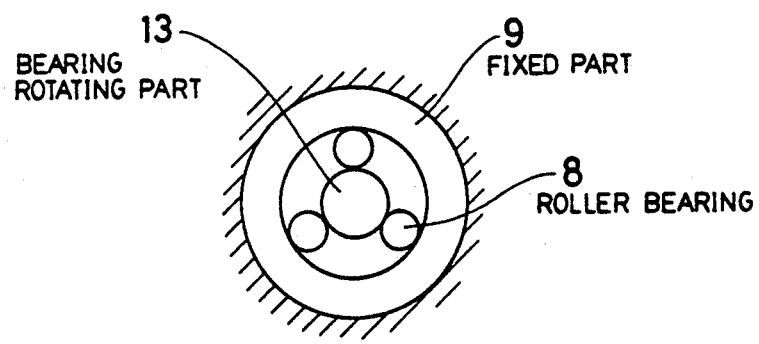
FIG. 30 is the sectional view of the roller bearing of FIG. 29 along the line A—A'.
Figure 29:
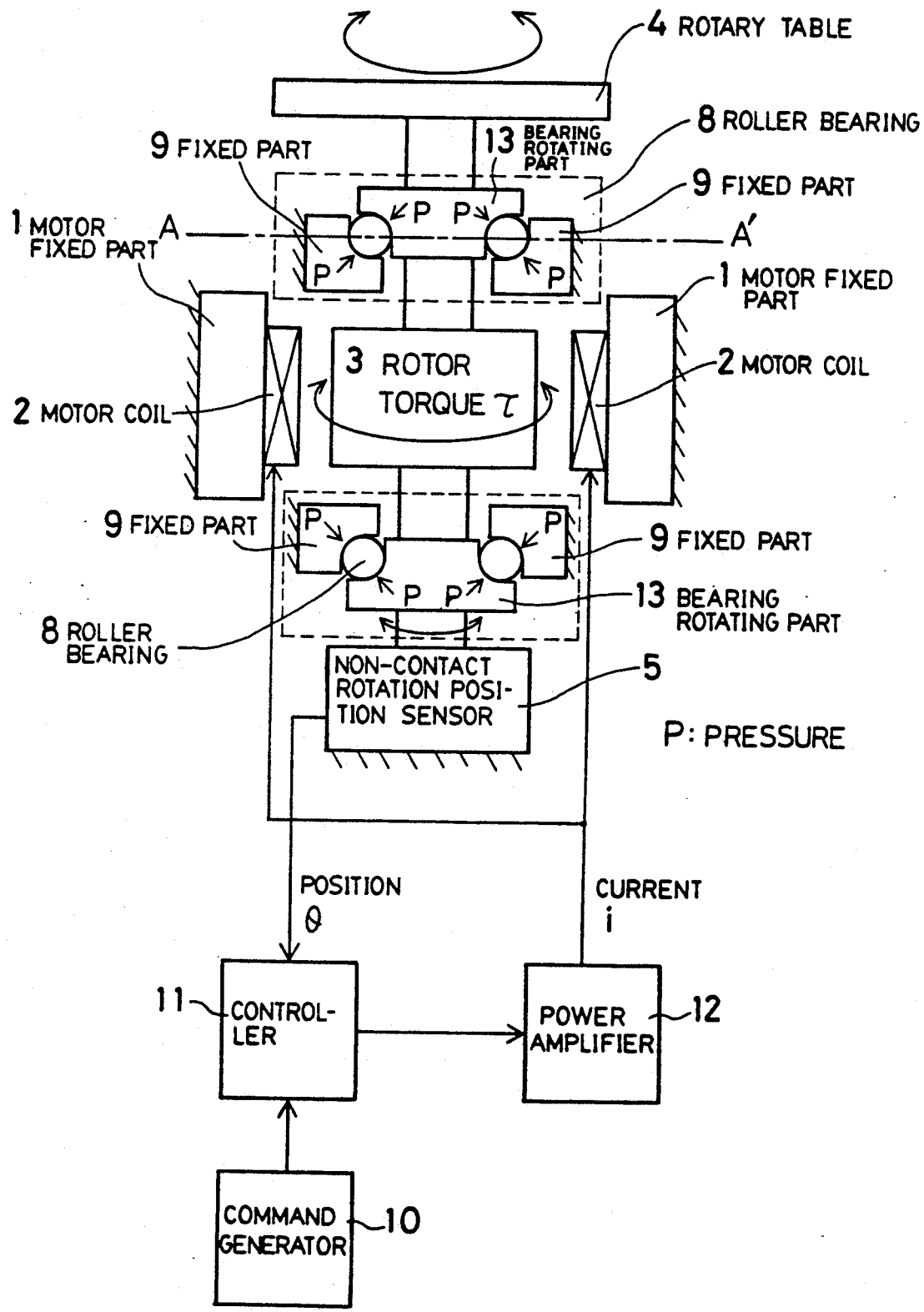
FIG. 29 is a diagram of an application example of this invention to the rotary positioning table.

FIG. 29 shows a sample structure of this invention applied to a rotary positioning table, and FIG. 30 is a section view of a roller bearing of FIG. 29 along the line A—A'.

When this invention is applied to a rotary positioning table, at least three balls are required between the rotating unit 13 and the fixed unit 9 as shown in FIG. 30, and the rotary table 4 to control the angular position is supported by roller bearing 8. By inserting balls between rotating unit 13 and the fixed unit 9 of the roller bearing 8 and by applying pressure, balls are elastically deformed.

For the rotary movement, a rotor 3 is mounted on a rotary table 4, and rotary table 4 is controlled by giving rotary torque $\tau$ directly by a perfectly non-contact type motor composed of rotor 3, motor coil 2 and motor fixed part 1.

The position sensor 5 is to measure the angular position (rotating angle) $\theta$ of the rotary table 4, and the command reference generator 10 is to generate the position reference r of the rotary table 4. The controller 11 performs the position control of the rotary table 4 by comparing the rotating angle $\theta$ with the reference r and by controlling the current i, flowing to the motor coil 2 by power amplifier 12, thus operating the rotary torque $\tau$. When it is assumed that the operating force f is the rotary torque $\tau$, the position x ($x_0$, $x_1$, $x_2$, x, x) is the position $\theta$ ($\theta_0$, $\theta_1$, $\theta_2$, $\theta$, $\theta$), friction force F ($F_1$, $F_2$) is friction torque T ($T_1$, $T_2$), and the mass M is inertia J, it becomes the same as the linear movement system.

The experimented data are given below.

Figure 31:
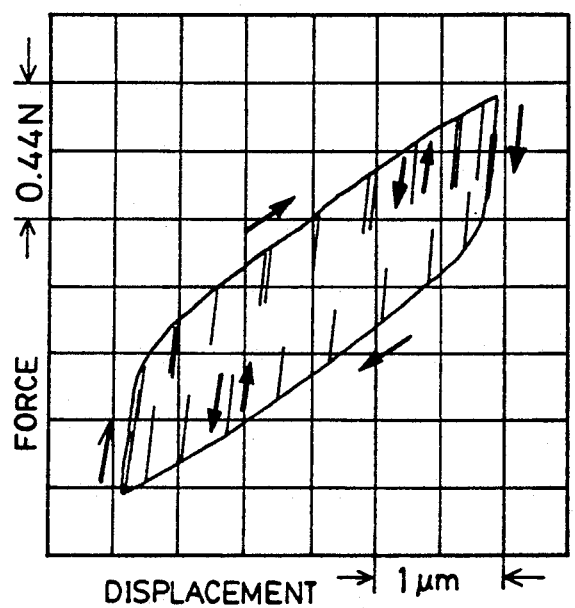
FIG. 31 is the measured force-to-displacement response when transitions between the regions I and II occur.
Figure 32:
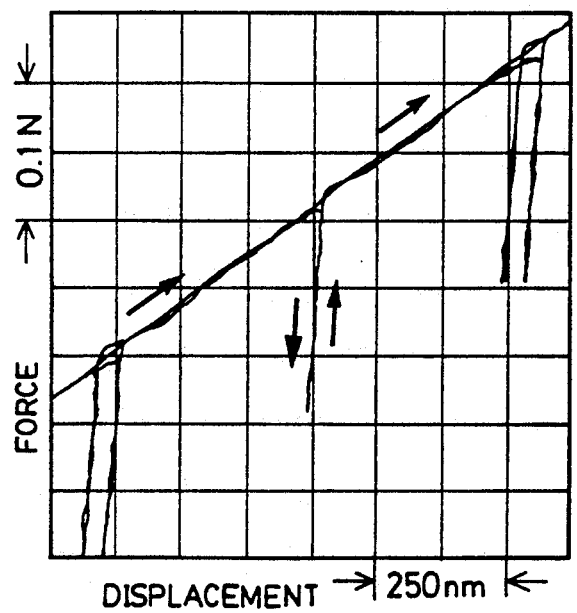
FIG. 32 is a partial magnified figure of FIG. 31.
Figure 33:
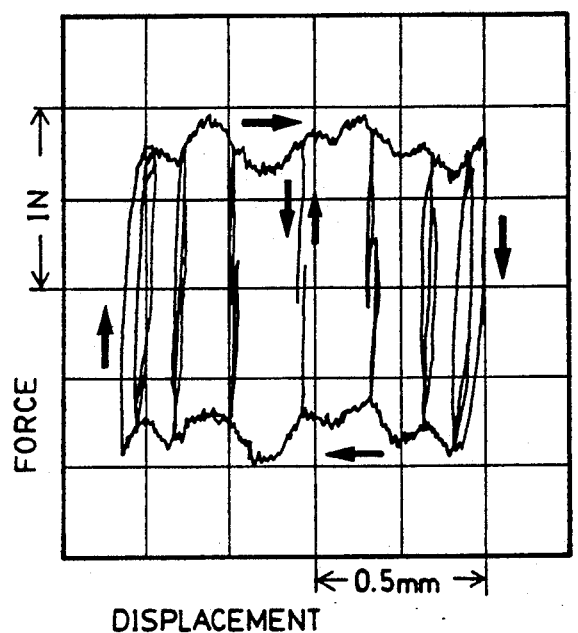
FIG. 33 is the measured force-to-displacement response when transitions between the regions II and III occur.
Figure 34:
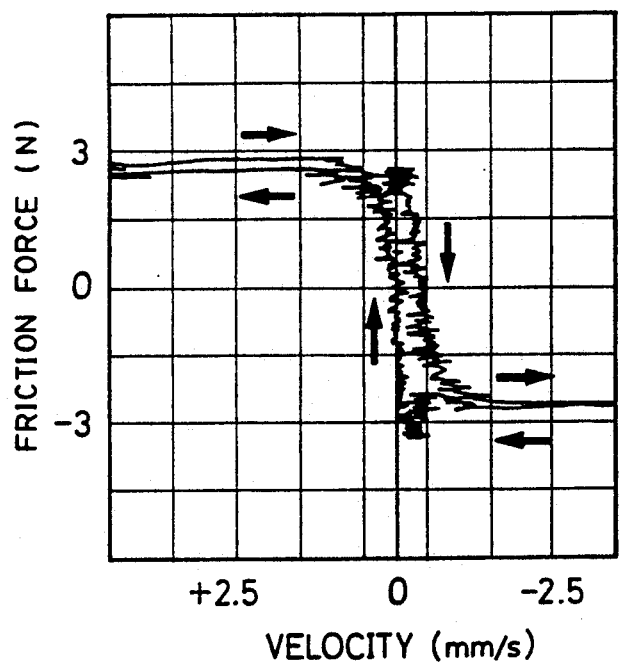
FIG. 34 is the measured velocity-to-friction force characteristics of the rolling guide.

FIG. 31 shows the force-to-displacement relationship when transitions between the regions I and II occur, FIG. 32 is a partially enlarged figure of FIG. 31, FIG. 33 shows the force-to-displacement relationship when transitions in the regions II and III occur, and FIG. 34 shows friction-force-to-velocity relationship of the rolling guide.

In FIG. 31, whisker shape response$indicate transitions between the regions I and II. Since the all wiskers have the same shape, it is evident that the characteristics of the region I do not vary for position changes. In FIG. 33, the external loop indicates the characteristics of the region III, and the whiskers indicate the characteristics of the region II. Thus, the characteristics of the region II also do not vary for position changes. In accelerating, any static friction force does not exist as shown in FIG. 34.

Figure 35:
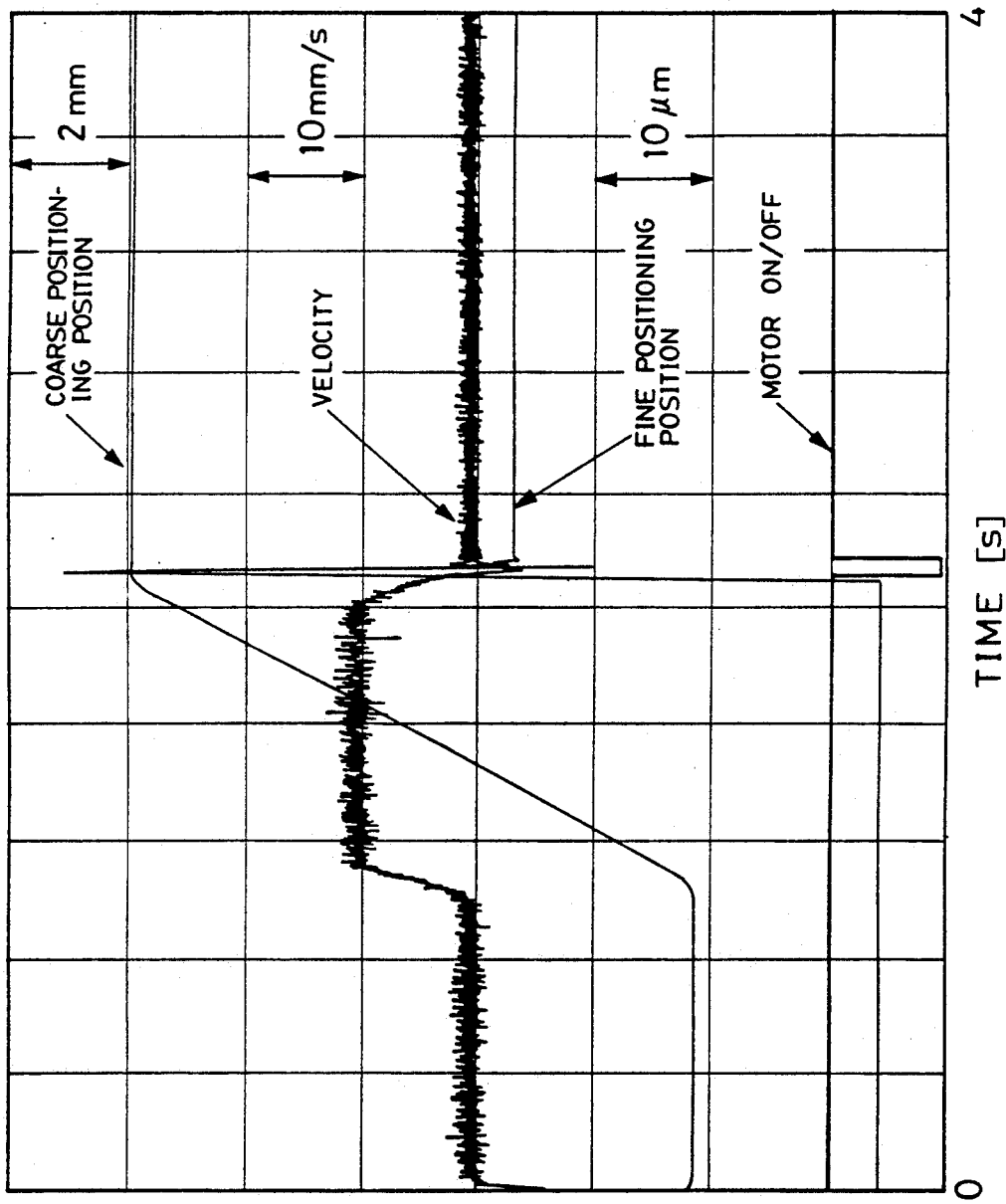
Figure 36:
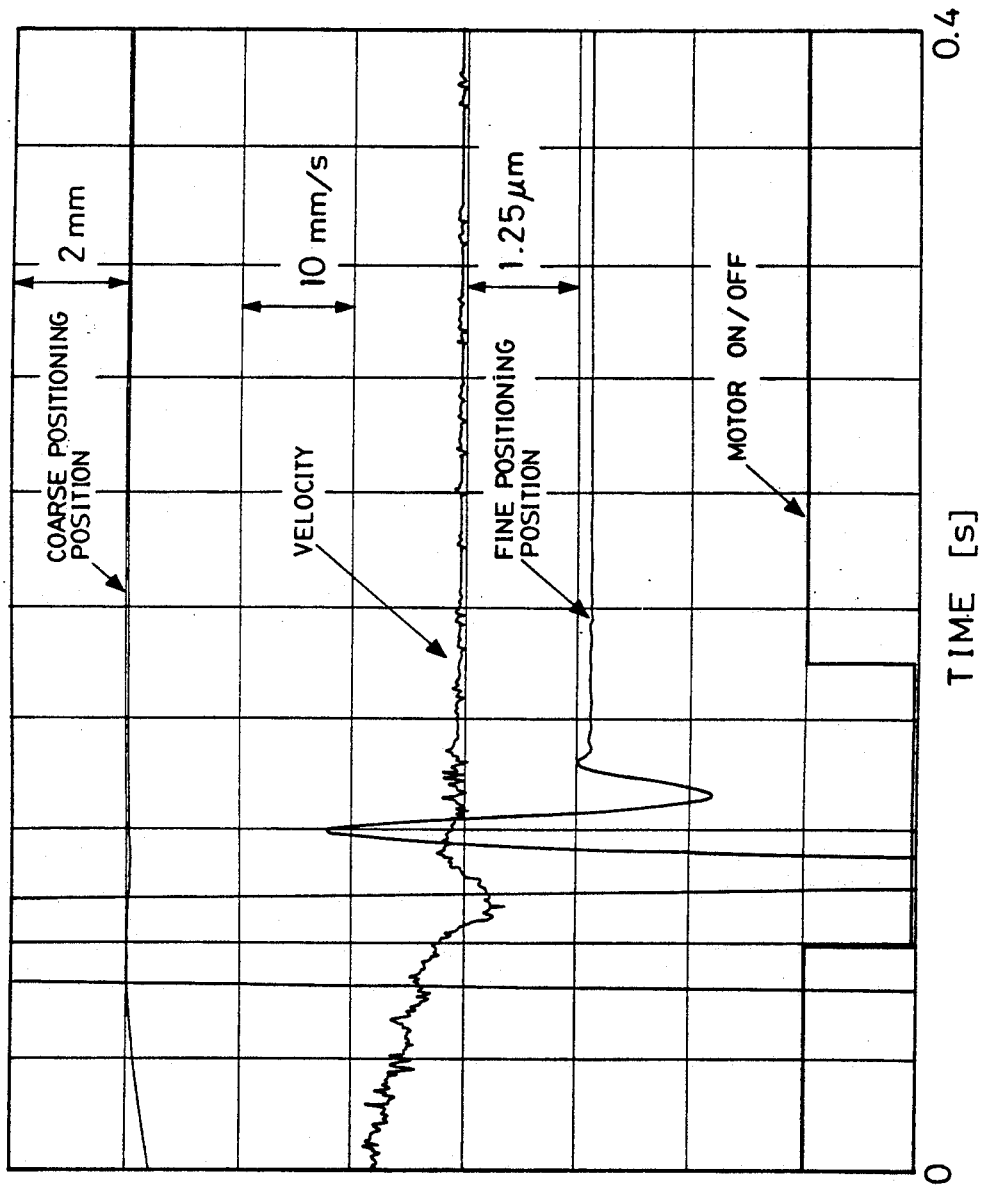
FIG. 36 is a partial enlargement of FIG. 35 near the motor OFF point.
Figure 37:
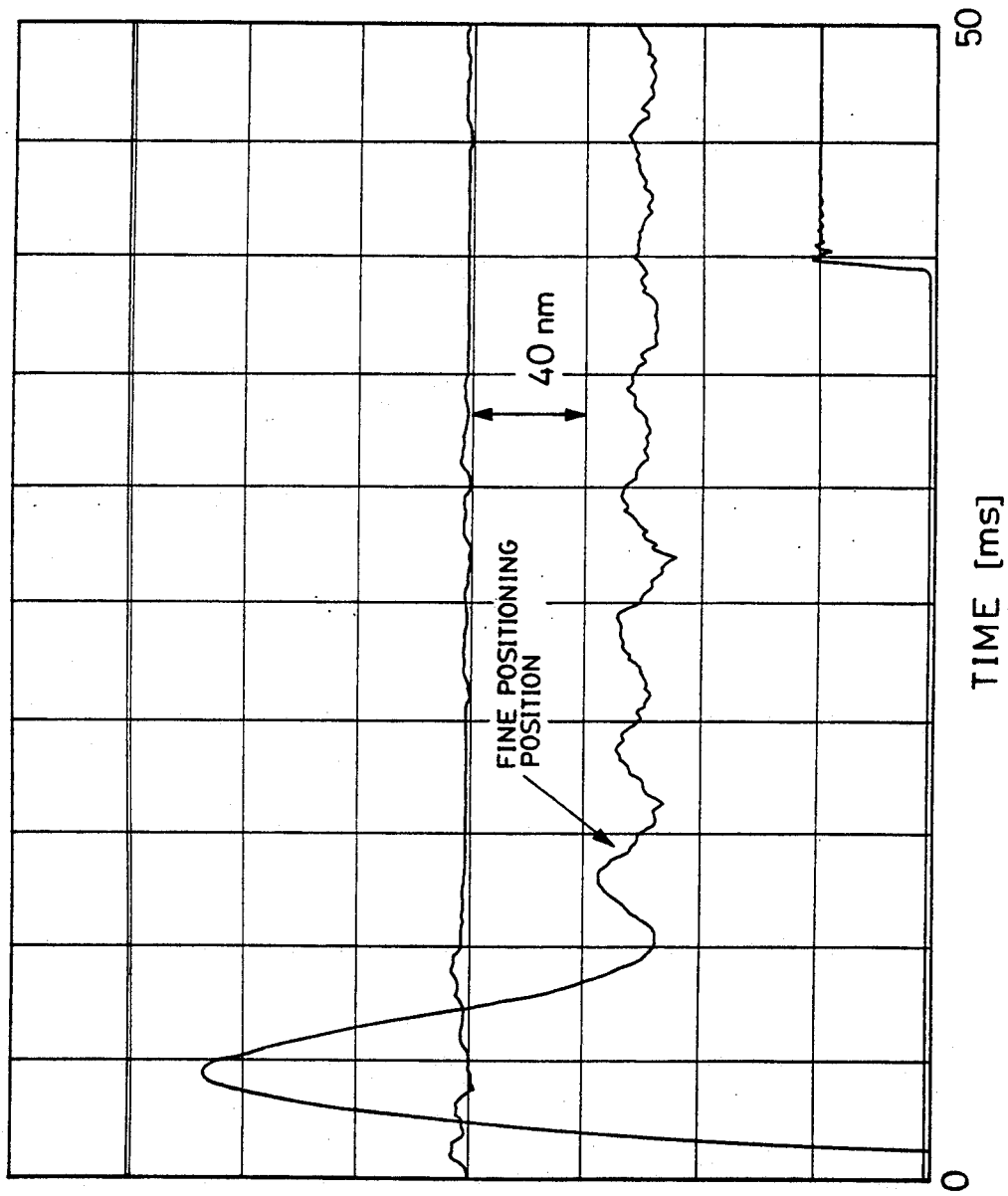
FIG. 37 is a further enlargement of FIG. 36 at the settling of vibration.

In the coarse positioning control, it is evident from the data of the fine adjustment position in FIG. 35 that, when the motor is turned off, it is returned by $\Delta$ and vibrated and that it is the vibration in the region II of about 40 Hz from FIG. 36. Also, it is apparent from FIG. 37 that it is the vibration in the region I of about 200 Hz. As shown in FIG. 38, after the coarse positioning, the motor is turned off. Then, it is switched over to fine positioning control and is turned on again. Thus, ultra-precision positioning of about 30 nm is performed by the subsequent fine positioning control. When switched over to fine positioning control, the control is achievable with the resolution of 1 nm.

As it is evident from the above explanation, rolling guide system is adopted as the guide unit according to the present invention. Utilizing the spring characteristics of rolling guide at minute displacement, the coarse positioning system and the fine positioning system are automatically and intrinsically achieved by the characteristics of the rolling guide. Compared with the conventional arrangement, it is possible to perform ultra-precise positioning of nanometer order by only the so-called coarse positioning system. Therefore, ultra-precise positioning can be achieved by simple and single system mechanism, and the device with high accuracy, high speed and high reliability with single arrangement can be provided. Particularly, the positioning with high resolution and high speed can be accomplished by utilizing all properties of the regions I, II and III possessed by the rolling guide, by moving toward the positioning goal point by the region III where friction force is in a constant and steady rolling status, and by performing the positioning in the region I of the spring with high rigidity.

What we claim is:

1. An ultra-precise positioning system, comprising:
   a movable part;
   a rolling guide;
   a fixed part in supporting contact with said rolling guide;
   a driving means for driving said movable part, said driving means comprising a non-contact motor which applies a force to said movable part without touching engagement with said movable part;
   a position measuring means for measuring a position of said movable part;
   a position reference generator means for generating a reference position of said movable part; and
   a positioning control means for controlling the position of said movable part by comparing the measured position to the reference position, said positioning control means having a first control mode in a first operational region in which a resistance force arising due to displacement of said movable part varies in magnitude as a function of the force applied to said movable part by said driving means, and a second control mode in a second operational region in which frictional resistance force of said rolling guide is in a saturated condition and normal rolling of said rolling guide takes place, so that a resistance force resisting the force applied to said movable part by said driving means is substantially constant.

2. An ultra-precise positioning system as set forth in claim 1, wherein in said first operational region, the resistance force resisting movement of said rolling guide varies as a substantially linear function of displacement of said rolling guide, and wherein the resistance force in said first operational region arises due to reversible and elastic spring characteristics of said rolling guide; and wherein said first operational region has a first operational subregion in which the resistance force varies at a first linear rate and a second operational subregion in which the resistance force varies at a second linear rate.

3. An ultra-precise positioning system as set forth in one of claims 1 or 2, wherein said positioning control means includes means for determining the current operational region, and wherein said positioning control means includes three kinds of positioning control characteristics, corresponding respectively to said first operational subregion, said second operational subregion, and said second operational region.

4. An ultra-precise positioning system as set forth in one of claims 1 or 2, wherein in said second operational region said rolling guide is deformed, and wherein coarse control is exerted by said positioning control means in said second operational region, and wherein fine positioning control is exerted in said first operation region by said positioning control means, and wherein, when said deformation is represented by $\Delta$ and the reference position is represented by $X_r$, a coarse positioning reference r is corrected as $$r' = \begin{matrix} r + \Delta & \text{if } X_r > 0 \\ r - \Delta & \text{of } X_r < 0 \end{matrix}$$

and $$r = X_r$$

during fine positioning.

5. An ultra-precise positioning system as set forth in one of claims 1 or 2, wherein said positioning control means applies the coarse positioning control in said second operational region near the reference position $X_r$, and includes a proportional-integral control circuit having an integration capacitor and an electrical resistance, wherein control is transferred between said first and second operational regions by discharge of said integration capacitor through said electrical resistance.

6. An ultra-precise positioning system as set forth in one of claims 1 or 2, wherein said positioning control means applies said coarse positioning in said second operational region reached near the reference position $X_r$, and forcibly causes the force of said driving means to become zero for a certain period of time, and control is transferred to another one of said operational regions.

7. An ultra-precise positioning system as set forth in claim 2, wherein said positioning control means determines whether the reference position is within said first operational subregion when positioning in said first and second operational regions is completed, and, when the reference position is within said first operational subregion, said positioning control means performing fine positioning control, and, when said reference position is not in said first operational subregion, a new positioning operation is repeatedly performed by said positioning control means in said second operational subregion towards the reference position $X_r$.

* * * * *